US012374584B2

(12) United States Patent
Parikh et al.

(10) Patent No.: US 12,374,584 B2
(45) Date of Patent: Jul. 29, 2025

(54) MULTI COLOR STACK FOR SELF ALIGNED DUAL PATTERN FORMATION FOR MULTI PURPOSE DEVICE STRUCTURES

(71) Applicant: Applied Materials, Inc., Santa Clara, CA (US)

(72) Inventors: Suketu Arun Parikh, San Jose, CA (US); Martin Jay Seamons, San Jose, CA (US); Jingmei Liang, San Jose, CA (US); Shuchi Sunil Ojha, Redwood City, CA (US); Tom Choi, Sunnyvale, CA (US); Nitin K. Ingle, San Jose, CA (US); Sanjay Natarajan, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 785 days.

(21) Appl. No.: 17/505,521

(22) Filed: Oct. 19, 2021

(65) Prior Publication Data

US 2022/0130722 A1 Apr. 28, 2022

Related U.S. Application Data

(60) Provisional application No. 63/106,866, filed on Oct. 28, 2020.

(51) Int. Cl.
*H01L 21/768* (2006.01)
(52) U.S. Cl.
CPC .. *H01L 21/76877* (2013.01); *H01L 21/76802* (2013.01); *H01L 21/76826* (2013.01)

(58) Field of Classification Search
CPC ........... H01L 21/31144; H01L 21/0337; H01L 21/76816; H01L 21/3086; H01L 21/0332;
(Continued)

(56) References Cited

U.S. PATENT DOCUMENTS 10,204,781 B1 2/2019 Lin et al.
11,133,177 B2 9/2021 Seamons et al.
(Continued)

OTHER PUBLICATIONS

Zimmerman, Paul, "Double patterning litography: double the trouble or double the fun?" SPIE Newsroom, http://spie.org/x35993.xml?pf=true&ArticleID=x35993, Jul. 20, 2009, 3 pgs.
(Continued)

*Primary Examiner* — David Chen
(74) *Attorney, Agent, or Firm* — Patterson + Sheridan, LLP

(57) ABSTRACT

A substrate processing method includes creating a mask on a top surface of a workpiece. A first portion of a gap fill material is overlaid by the mask and a second portion of the gap fill material is exposed through an opening in the mask. The method further includes exposing the workpiece to a plasma. The method further includes performing a first etching of the first portion of the gap fill material to create a first cavity while the second portion of the gap fill material remains in place, depositing a first metal-containing substance in the first cavity, performing a second etching of the second portion of the gap fill material to create a second cavity while the first metal-containing substance remains in place, and depositing a second metal-containing substance in the second cavity.

19 Claims, 19 Drawing Sheets

(58) Field of Classification Search
CPC .......... H01L 21/0338; H01L 21/32139; H01L 21/0273; H01L 21/0274; H01L 21/76877; H01L 21/76834; H01L 21/76897; H01L 21/76802; H01L 21/76832; H01L 21/76826; H01L 21/76837; H01L 21/76843; H01L 21/76892
USPC .............. 438/551, 669, 675, 700, 703, 717; 257/401, E21.19, E21.214, E21.231
See application file for complete search history.

(56) References Cited

U.S. PATENT DOCUMENTS

| | | | |
|---|---|---|---|
| 2017/0125248 A1* | 5/2017 | Siew | H01L 21/0332 |
| 2019/0181005 A1* | 6/2019 | Wada | H01L 21/3105 |
| 2020/0075405 A1* | 3/2020 | Huang | H01L 23/53228 |
| 2020/0381248 A1 | 12/2020 | Sun et al. | |
| 2021/0305087 A1 | 9/2021 | Parikh | |

OTHER PUBLICATIONS

Sadjadi, Reza, et al., "Plasma-assisted CD Shrink and Overlay Metrology Techniques for Double Patterning", ISSM Paper: PE-O-167, IEEE 2007, 3 pages.

Mohanty, Nihar, et al., "Semiconductor scaling via self-alighed block patterning", SPIE, https://spie.org/news/6587-semiconductor-scaling-via-self-alighed-block-patterning?SSO=1, Mar. 17, 2017, 4 pages.

* cited by examiner

MULTI COLOR STACK FOR SELF ALIGNED DUAL PATTERN FORMATION FOR MULTI PURPOSE DEVICE STRUCTURES

CROSS-REFERENCE TO RELATED APPLICATIONS

This application claims benefit of U.S. provisional patent application Ser. No. 63/106,866, filed Oct. 28, 2020, which is herein incorporated by reference.

BACKGROUND

Field

Embodiments of the present disclosure generally relate to the manufacture of semiconductor devices, and more specifically to the formation of structures in semiconductor devices.

Description of the Related Art

Semiconductor devices such as an integrated circuit (IC) generally have electronic circuit elements, such as transistors, diodes and resistors fabricated integrally on a semiconductor substrate. The various circuit elements are connected through conductive connectors to form a complete circuit, which can contain billions of individual circuit elements. Advances in semiconductor materials and processing techniques have resulted in reducing the overall size of the IC while increasing the number of circuit elements. Additional miniaturization is highly desirable for improved IC performance and cost reduction. Interconnects provide the electrical connections between the various electronic elements of an IC, and the interconnects form the connections between these elements and the device's external contact elements, such as pins, for connecting the IC to other circuits. Typically, interconnect lines form the horizontal connections between the electronic circuit elements of an IC device, while conductive via plugs form the vertical connections between various electronic circuit elements, resulting in layered connections.

A variety of techniques are employed to create interconnect lines and vias. One such technique involves a process generally referred to as a dual damascene process, which includes forming a trench and an underlying via hole. The trench and the via hole are simultaneously filled with a conductor material, for example a metal, thus simultaneously forming an interconnect line and an underlying via plug.

The manufacture of semiconductor devices includes the formation of nano-scale interconnect structures in semiconductor substrates. Patterns of structures are formed in substrates by multi-operation sequences of material deposition and removal. Because of the tiny dimensions and pitch of the structures, it is difficult to obtain consistent structure shapes, dimensions, and spacing by such multi-operation processes. Imprecise fabrication typically results in misalignment of structures, poor contacts between individual structures, and unwanted short circuits between adjacent structures. These problems are exacerbated by the miniaturization of semiconductor devices that entails the formation of structures of differing sizes in substrates and the formation of multiple patterns of structures in substrates.

Thus, there is a need for improved processes that facilitate the consistent accurate formation of multiple patterns of structures in semiconductor devices.

SUMMARY

The present disclosure generally relates to methods of forming structures in semiconductor devices. In one embodiment, a substrate processing method includes creating a mask on a top surface of a workpiece. A first portion of a gap fill material is overlaid by the mask and a second portion of the gap fill material is exposed through an opening in the mask. The method further includes exposing the workpiece to a plasma. The first portion of the gap fill material is shielded from the plasma by the mask, and the second portion of the gap fill material is exposed to the plasma. The method further includes exposing the first portion of the gap fill material and the second portion of the gap fill material to an etching process. The etching process selectively removes the first portion of the gap fill material versus the second portion of the gap fill material, and etches the first portion of the gap fill material to form a first cavity. The method further includes depositing a first metal-containing substance in the first cavity to create a first metal-containing feature, etching the second portion of the gap fill material to create a second cavity while the first metal-containing substance remains in place, and depositing a second metal-containing substance in the second cavity to create a second metal-containing feature.

In another embodiment, a substrate processing method includes creating a mask on a top surface of a workpiece. A first portion of a gap fill material is overlaid by the mask and a second portion of the gap fill material is exposed through an opening in the mask. The method further includes exposing the workpiece to a plasma. The first portion of the gap fill material is shielded from the plasma by the mask, and the second portion of the gap fill material is exposed to the plasma. The method further includes exposing the first portion of the gap fill material and the second portion of the gap fill material to an etching process. The etching process selectively removes the first portion of the gap fill material versus the second portion of the gap fill material, and etches the first portion of the gap fill material to form a first cavity. The method further includes depositing a temporary fill material in the first cavity, etching the second portion of the gap fill material to create a second cavity while the temporary fill material remains in place, removing the temporary fill material from the first cavity, and depositing a metal-containing substance in the first and second cavities to create a metal-containing feature.

In another embodiment, a substrate processing method includes creating a patterning hardmask containing first spaces on a substrate, depositing a gap fill material on the substrate in the first openings, planarizing the gap fill material to create a planarized surface, and creating a mask on the planarized surface. The mask contains second openings. The method further includes exposing the mask to a plasma such that a first portion of the gap fill material is shielded from the plasma by the mask, and a second portion of the gap fill material is exposed to the plasma. The method further includes removing the mask and exposing the first portion of the gap fill material and the second portion of the gap fill material to an etching process. The etching process selectively removes the first portion of the gap fill material versus the second portion of the gap fill material, and etches the first portion of the gap fill material to form a first cavity. The method further includes depositing a first metal-containing substance in the first cavity to create a first metal-containing feature, performing a second etching of the gap fill material to create a second cavity, and depositing a second metal-containing substance in the second cavity to create a second metal-containing feature.

In another embodiment, a substrate processing method includes creating a patterning hardmask containing first openings on a substrate, depositing a gap fill material on the substrate in the first openings, planarizing the gap fill material to create a planarized surface, and creating a mask on the planarized surface. The mask contains second openings. The method further includes exposing the mask to a plasma such that a first portion of the gap fill material is shielded from the plasma by the mask, and a second portion of the gap fill material is exposed to the plasma. The method further includes removing the mask and exposing the first portion of the gap fill material and the second portion of the gap fill material to an etching process. The etching process selectively removes the first portion of the gap fill material versus the second portion of the gap fill material, and etches the first portion of the gap fill material to form a first cavity. The method further includes depositing a temporary fill material in the first cavity, performing a second etching of the gap fill material to create a second cavity, removing the temporary fill material from the first cavity, and depositing a metal-containing substance in the first and second cavities to create a metal-containing feature.

In another embodiment, a substrate processing method includes creating a mask on a top surface of a workpiece. A gap fill material and a filler material are exposed through an opening in the mask. The method further includes etching the filler material to a first depth below the mask, then exposing the gap fill material to a plasma, and etching the filler material to a second depth greater than the first depth below the mask.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure concerns methods for manufacturing semiconductor devices, and particularly relates to the formation of multiple self-aligned patterns of vias, contacts, lines, cavities containing conductive material or other features formed in a semiconductor device.

Figure 1:
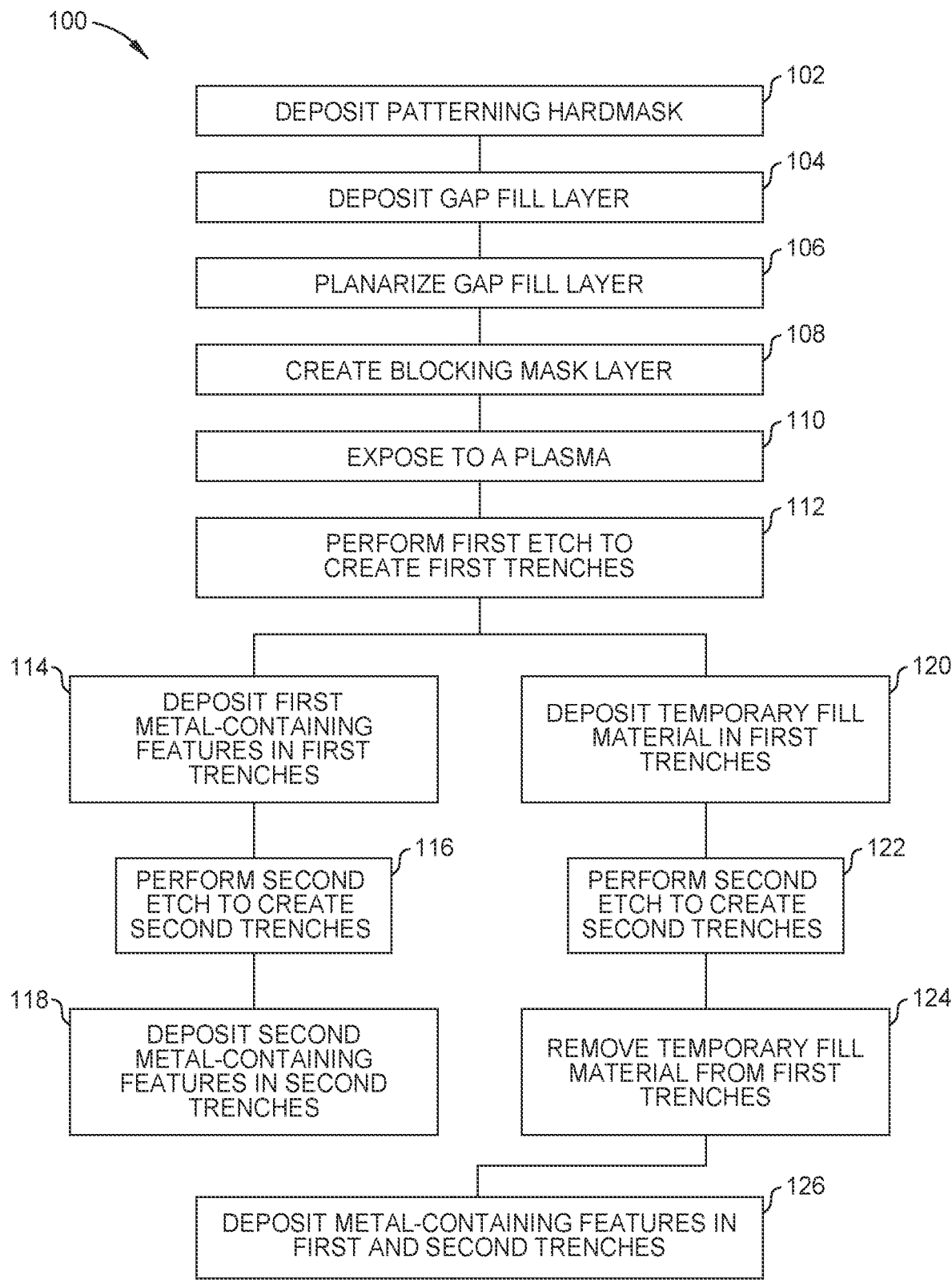
FIG. 1 is a flow chart of method operations for forming metal-containing features in a substrate.
Figure 2:
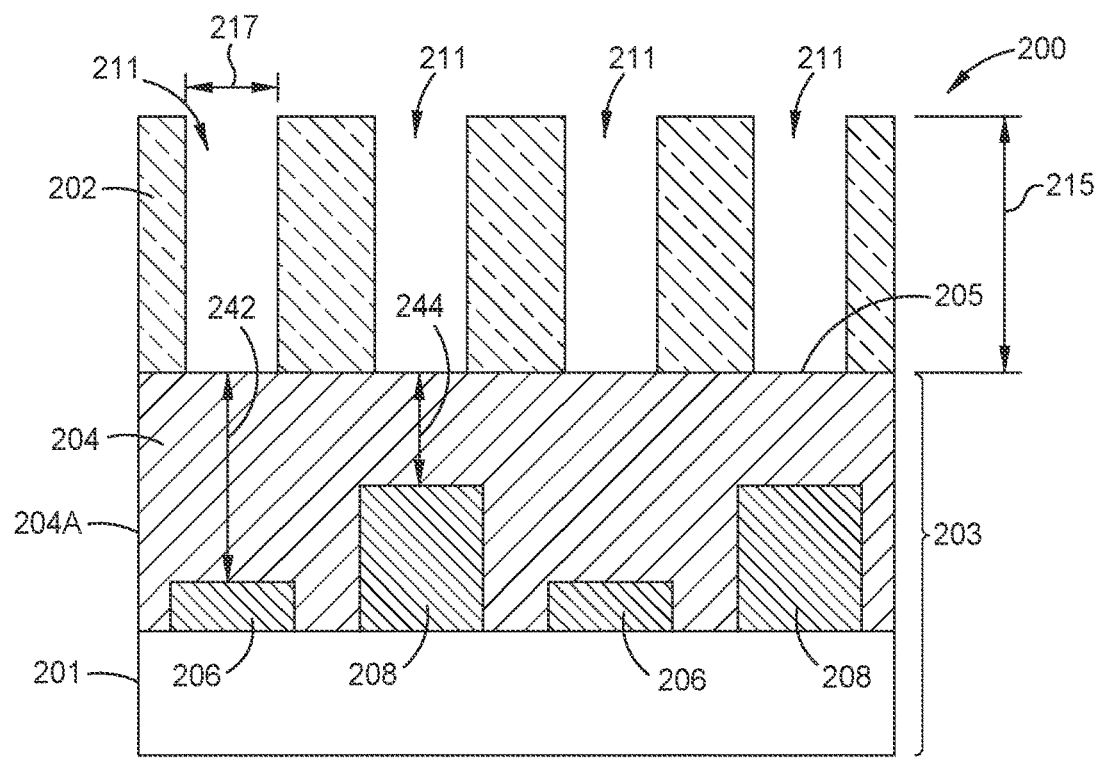
FIG. 2 is a schematic side view of a workpiece including a substrate after completion of one of the operations of the method of FIG. 1.

FIG. 1 illustrates a method 100 for use in manufacturing a semiconductor device. In operation 102, and as shown in FIG. 2, a workpiece 200 includes a hardmask 202 defining a pattern that is deposited or otherwise formed on a substrate 203. The substrate 203 includes at least a base substrate 201. While not intending to be limiting as to the scope of the disclosure provided herein, the discussion below includes a substrate 203 that includes at least one interconnect layer 204 and a base substrate 201. In some embodiments, the base substrate 201 includes a semiconductor material, such as a silicon, silicon germanium or III-V material. The interconnect layer 204 typically includes a dielectric material 204A, such as a silicon dioxide material ($SiO_2$) or low-k material, that includes various patterned conductive features, such as first and second elements 206, 208, as shown in FIG. 2. For simplicity of discussion and illustration the base substrate 201 has been omitted from a number of the figures and discussion provided below.

The first and second elements 206, 208 contain a metal material deposited during manufacturing processes performed prior to operation 102. A top surface of the first element 206 is located at a first depth 242 below a top surface 205 of the interconnect layer 204. A top surface of the second element 208 is located at a second depth 244 below the top surface 205 of the interconnect layer 204. As shown in FIG. 2, the first depth 242 is greater than the second depth 244. However, it is contemplated that the first depth 242 and second depth 244 may be substantially the same. It is further contemplated that the first depth 242 may be less than the second depth 244.

In one embodiment, the hardmask 202 contains a material such as silicon nitride (SiNx), silicon oxide (SiOx), aluminum oxide (AlOx), silicon carbide (SiC), silicon carbon nitride (SiCN), hafnium oxide (HfOx) and the like. Alternatively, the hardmask 202 may contain a metal or a metal-based compound, such as ruthenium, titanium nitride, or tungsten. In one example, the material used to form the hardmask is a silicon oxide (SiOx) includes silicon dioxide (SiO2). The patterned hardmask 202, illustrated in FIG. 2, includes openings 211, which may include lines, blocks, vias or a combinations thereof. The openings 211 have a width 217 from about 5 nm to about 30 nm, and have a height 215 from about 5 nm to about 50 nm. However, it is contemplated that the openings 211 may have widths and/or heights that are outside the stated example ranges.

Figure 3:
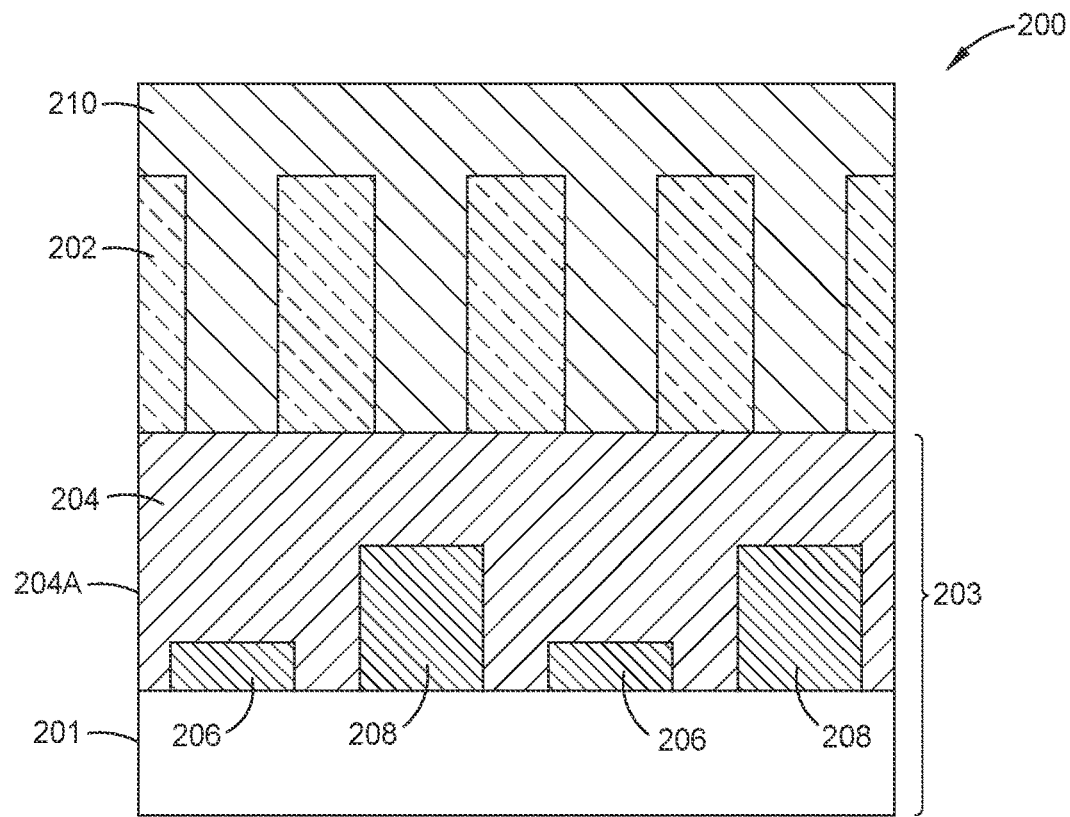
FIG. 3 is a schematic side view of the workpiece after completion of another operation of the method of FIG. 1.

In operation 104 of FIG. 1, and as shown in FIG. 3, a gap fill is performed over the patterned hardmask in a deposition chamber. The gap fill operation involves depositing a gap fill material 210 between and over the patterned hardmask 202. In one embodiment, the gap fill material 210 is a flowable material, such as a flowable dielectric material. The flowable material has characteristics of a solid material but also has the ability to "flow" during the deposition process, thus enabling substantially void-free bottom-up material deposition. In one embodiment, the gap fill material 210 is a flowable, low-k material. In one embodiment, the gap fill material 210 is a deposited blanket film. The gap fill material 210 is deposited using a chemical vapor deposition (CVD) process, such as a flowable chemical vapor deposition (FCVD) process, such as an inductively coupled plasma process or a capacitively coupled plasma process.

As an example, the gap fill material 210 contains any one of silicon, oxygen, carbon, nitrogen, or combination(s) thereof. As an example, the gap fill material 210 includes a substance in an amorphous state, such as amorphous carbon, amorphous silicon, and the like. It is contemplated that at least an upper portion of the gap fill material 210 is selected to be a material that has a different composition from the material of the hardmask 202. For example, if the hardmask 202 material is an oxide, such as silicon dioxide, then the gap fill material 210 is a nitride containing material, such as silicon nitride or the like. Alternatively, if the hardmask 202 material is a nitride, such as silicon nitride, then the gap fill material 210 is an oxide containing material, such as silicon dioxide or the like. In further examples, if the hardmask 202 material is aluminum oxide or silicon carbide, then the gap fill material 210 is a nitride containing material, such as silicon nitride, an oxide containing material, such as silicon dioxide, or a combination of a nitride containing material and an oxide containing material. It is desirable for at least the upper portion of the gap fill material 210 to have a different etch selectivity after deposition or further processing from the material used to form the hardmask 202.

The gap fill material 210 is deposited utilizing one or more precursors. In some embodiments, the dielectric precursor is an organosilicon compound that includes silicon, carbon, and hydrogen, such as silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetra-methylcyclotetrasiloxane (TMCTS), tetramethyl-diethoxy-disiloxane (TMDDSO), dimethyl-dimethoxy-silane (DMDMS), Tetramethoxysilane (TMOS) or combinations thereof. In some embodiments, the dielectric precursor is an organosilicon compound that includes silicon, nitrogen, hydrogen, and chlorine, such as silyl-amine and its derivatives including trisilylamine (TSA) and disilylamine (DSA), an organosilicon compound that includes silicon, nitrogen, hydrogen, and oxygen, or a combination thereof. In one example, two or more precursors are utilized during a deposition process, such as a combination of octamethylcyclotetrasiloxane (OMCTS) and at least one other precursor such as Tetramethoxysilane (TMOS).

In embodiments where the gap fill material 210 is an oxide containing material, the plasma process utilizes an oxygen plasma, a helium-oxygen plasma, or a hydrogen-oxygen plasma to facilitate deposition and/or curing of the gap fill material 210. In embodiments where the gap fill material 210 is a nitride containing material, the plasma process utilizes a nitrogen plasma, an ammonia plasma, a helium-nitrogen plasma, a helium-ammonia plasma, a hydrogen-ammonia plasma or a hydrogen-nitrogen plasma to facilitate deposition and/or curing of the gap fill material 210. In some embodiments, the gap fill material 210 is densified by use of a plasma process that utilizes a hydrogen plasma, an inert gas containing plasma (e.g., Ar, Kr, He, etc.), alone or as a combination thereof.

In one embodiment, a plasma is generated outside the deposition chamber and flowed into a processing region of the deposition chamber (e.g., remote plasma) along with a carrier gas (e.g. Ar, He). In another embodiment, the plasma is generated within the deposition chamber (direct plasma). The plasma is generated by the dissociation of a processing precursor gas including molecular oxygen (O2), ozone (O3), molecular hydrogen (H2), a nitrogen-hydrogen compound (e.g., NH3, N2H4) a nitrogen-oxygen compound (e.g., NO, NO2, N2O), a hydrogen-oxygen compound (e.g., H2O, H2O2), a nitrogen-hydrogen-oxygen compound (e.g., NH4OH), a carbon-oxygen compound (CO, CO2), or a combination thereof. In a chamber plasma region, O*, H*, and/or N*-containing radicals may be activated, such as O*, H*, N*, NH3*, N2H4*, NH2*, NH*, N*O*, C3H6*, C2H2*, or a combination thereof.

In some embodiments, a remote plasma source (RPC) generates the radicals outside the deposition chamber (referred to as "radical flux"), which are then delivered into the deposition chamber and surface of the gap fill material 210 disposed over the substrate 203 at a flow rate between about 1 sccm and about 10,000 sccm.

In some embodiments, a plasma is generated within the deposition chamber by a capacitively coupled plasma (CCP) source, which is driven by a radio-frequency (RF) power supply. One of two electrodes is connected to the power supply and the other one is grounded. In some embodiments, a mesh is disposed within the deposition chamber between the CCP source and the interconnect layer 204 to prevent the delivered dielectric precursor from bombardment by the plasma.

One or more radicals (also referred to as reactive gas) in the processing region react with the delivered dielectric precursor to form a dielectric film layer of the gap fill material 210. The composition of the formed dielectric film is adjusted by changing the composition of the reactive gas in the radical flux. To form an oxygen-containing film, such as SiO, SiC, SiOC, SiON, and SiCON, the reactive gas may be, for example, oxygen (O2), ozone (O3), or water (H2O). To form a nitrogen-containing film, such as SiON, SiCON, and SiN films, the reactive gas may be, for example, ammonia (NH3), hydrazine (N2H4), nitrogen dioxide (NO2), or nitrogen (N2). To form a carbon-containing film, the reactive gas may be, for example, propylene (C3H6) or acetylene (C2H2).

When oxygen (O2) radicals in the processing region react with the delivered dielectric precursor, the delivered dielectric precursor is hydrophilized (i.e., hydroxyl groups (—OH) are attached to the organosilicon compounds). That is, oxygen (O2) radicals in the deposition chamber cause replacement of methyl groups R (—CH3) with hydroxyl groups (—OH) in the organosilicon compounds in the delivered dielectric precursor, forming silanol groups (Si—OH).

Figure 4:
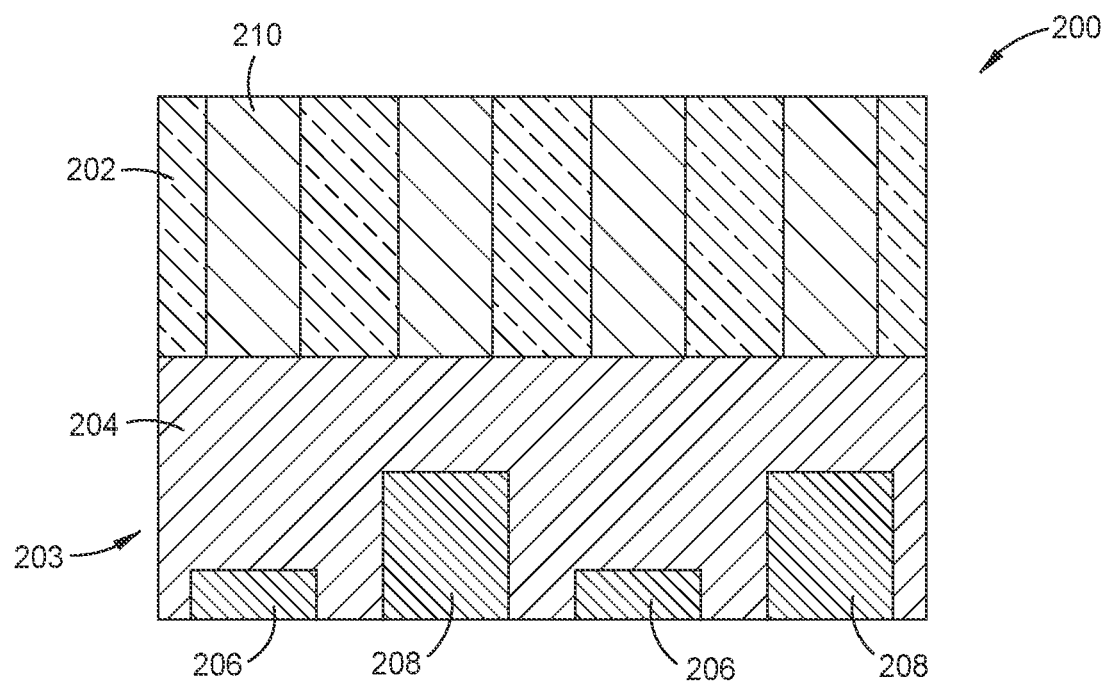
FIG. 4 is a schematic side view of the workpiece after completion of another operation of the method of FIG. 1.

In operation 106 of FIG. 1, and as shown in FIG. 4, the workpiece 200 is subjected to a planarization process, such as by chemical mechanical polishing (CMP) to remove the portion of the gap fill material 210 that covers the hardmask 202. In some embodiments of operation 106, the planarization process alternately includes by an etch-back type of dry etching process (e.g., blanket etch process) to remove the portion of the gap fill material 210 that covers the hardmask 202. The planarization removes a portion of the gap fill material 210 to expose portions of the hardmask 202. For example, the planarization removes sufficient gap fill material 210 to create a substantially planar surface that includes the hardmask 202 material and remaining gap fill material 210 between individual openings 211 formed in the hardmask 202.

Figure 5:
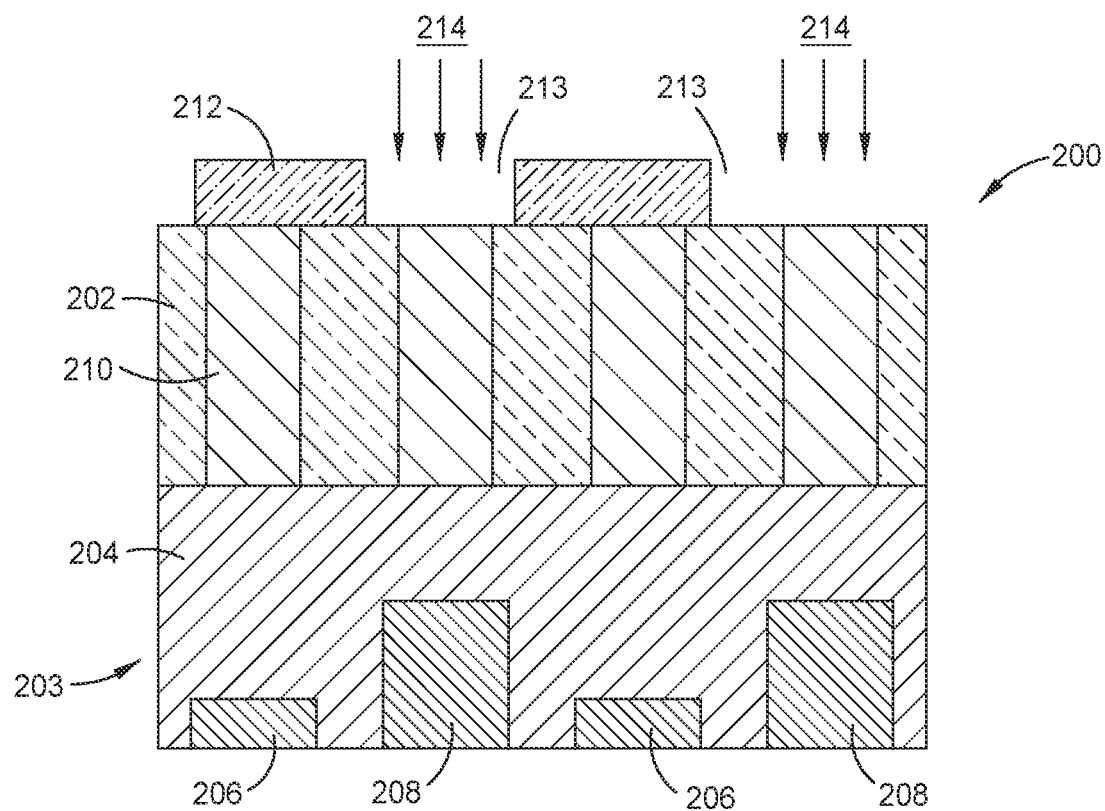
FIG. 5 is a schematic side view of the workpiece after completion of another operation of the method of FIG. 1.

In operation 108 of FIG. 1, and as shown in FIG. 5, a blocking mask layer 212 is deposited on the workpiece 200. The blocking mask layer 212 is typically a photoresist layer that is patterned as shown in FIG. 5. However, in some embodiments, the blocking mask layer 212 is a carbon containing layer that is deposited using a plasma deposition process, such as a chemical vapor deposition (CVD) process, and then patterned as shown in FIG. 5.

In one example, the blocking mask layer 212 contains an ultraviolet (UV) sensitive photoresist material. Exposure of the blocking mask layer 212 to ultraviolet (UV) radiation according to a pattern results in configuration of the blocking mask layer 212 according to the pattern. In some embodiments, the UV sensitive photoresist material is a positive resist, such that when portions of the blocking mask layer 212 are exposed to the UV radiation they can be removed from the workpiece 200 in a subsequent developing treatment, leaving one or more openings 213 in the blocking mask layer 212. Alternatively, in some embodiments, the UV sensitive photoresist material is a negative resist, such that the portions of the blocking mask layer 212 that are exposed to the UV radiation become fixed on the workpiece 200, and those portions of the blocking mask layer 212 that are not exposed to the UV radiation are removed from the workpiece 200 in a subsequent developing treatment, leaving one or more openings 213 in the mask 212. As shown in FIG. 5, the patterned blocking mask layer 212 is configured to cover some portions of the gap fill material 210. The one or more openings 213 of the mask 212 expose some portions of the hardmask 202 and some portions of the gap fill material 210.

In some embodiments, which may be combined with other embodiments, the blocking mask layer 212 pattern is formed using a simplified and/or less dimensionally stringent (i.e., larger critical dimension (CD) size) lithographic patterning process than conventional processes that would be used to form a similar sized structure having openings 211 due to an increase in the allowable misalignment of the openings 213 relative to the size of the openings 211 in the hardmask 202 as is discussed further below. The non-critical nature of the formed pattern leaves desired portions of gap fill material 210 uncovered without necessitating that an edge of the pattern be precisely coincident with an interface between the gap fill material 210 and the hardmask 202 material. Thus, an opening 213 in the blocking mask layer 212 exposes a portion of the gap fill material 210 and one or more portions of the hardmask 202 that borders on the uncovered gap fill material 210.

In operation 110 of FIG. 1, and as shown in FIG. 5, the uncovered gap fill material 210 is modified by exposure to a plasma, which is shown by arrows 214 in FIG. 5, in a processing chamber.

Figure 6:
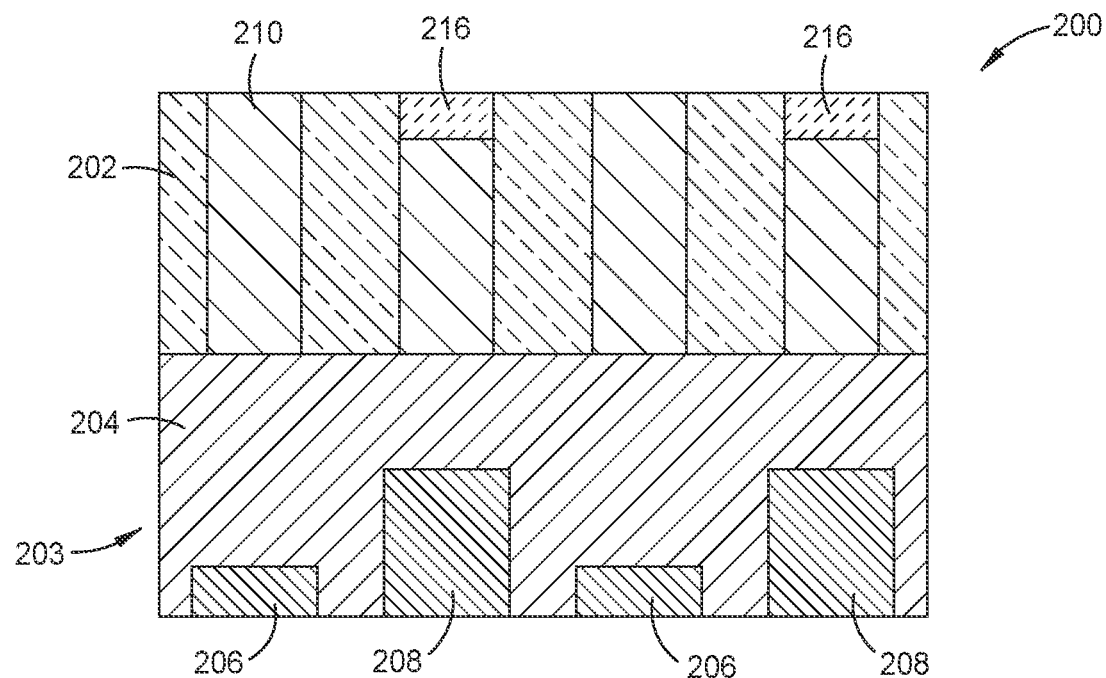
FIG. 6 is a schematic side view of the workpiece after completion of another operation of the method of FIG. 1.

As a result of the exposure to the plasma, material of the hardmask 202 remains substantially unchanged. However, the non-covered gap fill material 210 that is exposed to the plasma forms a resilient layer 216, as shown in FIG. 6 (side view of workpiece 200). During operation 110 the exposed regions of the uncovered gap fill material 210 are exposed to a plasma, such as an inductively coupled plasma (ICP), capacitively coupled plasma (CCP) or microwave generated plasma, that includes a modifying gas to modify a surface region of the gap fill material 210 to form the resilient layer 216. During operation 110 the exposed regions of the uncovered gap fill material 210 may alternately or additionally be exposed to radicals formed in the modifying gas, which are generated by a remote plasma source (RPS) or other plasma source.

The resilient layer 216 exists at the top of the exposed gap fill material 210. By appropriate selection of the operating parameters, a thickness of the resilient layer 216 can be controlled. For example, the thickness of the resilient layer 216 is controlled to be from about 1 nm to about 50 nm, such as from about 1 nm to about 40 nm, such as from about 1 nm to about 30 nm, such as from about 1 nm to about 20 nm, such as from about 1 nm to about 10 nm, such as about 5 nm. In general, the resilient layer 216 is formed such that the resilient layer 216 has a different etch selectivity to regions of the gap fill material 210 that have not been exposed to the plasma during operation 110. The term etch selectivity as used herein is intended to describe a difference in etch rate of different materials that are exposed to the same wet or dry etching process. A high etch selectivity is generally used to describe materials or a process where the etch rate of a first material is significantly different from the etch rate of a second material that is exposed to the same etching process. In one non-limiting example, a high etch selectivity may be found where the etch rate of first material is at least one order of magnitude greater than the etch rate of a second material that is exposed to the same etching process. Thus, after removing the blocking mask layer 212 in a subsequent operation, as discussed further below, the gap fill material 210 that does not include a resilient layer 216 formed thereon can be selectively removed by use of first etching process, that may be a wet or dry etching process.

However, the resilient layer 216 will also include an etch selectivity to the material used to form the hardmask 202, and thus allows the resilient layer 216 to be selectively removed versus the hardmask 202 by use of a second etching process, which may be a wet or dry etching process. In some embodiments, in which the hardmask 202 includes a SiN material the modifying process performed in operation 110 can include an oxidizing process that includes exposing the exposed gap fill material 210 to a plasma that includes a modifying gas that includes an oxidizing gas, such as oxygen (O2), and one or more second gases, such as argon (Ar), helium (He) and/or hydrogen (H2) to form the resilient layer 216. In one example, the resilient layer 216 will include an oxidized gap fill material, such as a SiOC material that is formed on a deposited SiC containing gap fill material 210. In another embodiments, in which the hardmask 202 includes a SiOx material, the modifying process performed in operation 110 includes a nitridation process that includes exposing the exposed gap fill material 210 to a plasma that includes a modifying gas that includes a nitrogen containing gas, such as nitrogen (N2) and/or ammonia (NH3), and one or more second gases, such as argon (Ar), helium (He) and/or hydrogen (H2) to form the resilient layer 216. In one example, the resilient layer 216 will include an oxidized gap fill material, such as a SiCN material that is formed on a deposited SiC containing gap fill material 210. In yet another embodiment, in which the hardmask 202 includes an AlOx material or a SiC material, the modifying process performed in operation 110 can include a process that includes exposing the exposed gap fill material 210 to a plasma that includes a modifying gas that includes both an oxidizing gas and a nitrogen containing gas, such as oxygen (O2) and nitrogen (N2) and/or ammonia (NH3), and one or more second gases, such as argon (Ar), helium (He) and/or hydrogen (H2) to form the resilient layer 216. In one example, the resilient layer 216 will include an oxidized gap fill material, such as a SiON material that is formed on a deposited SiOx containing gap fill material 210.

Figure 7A:
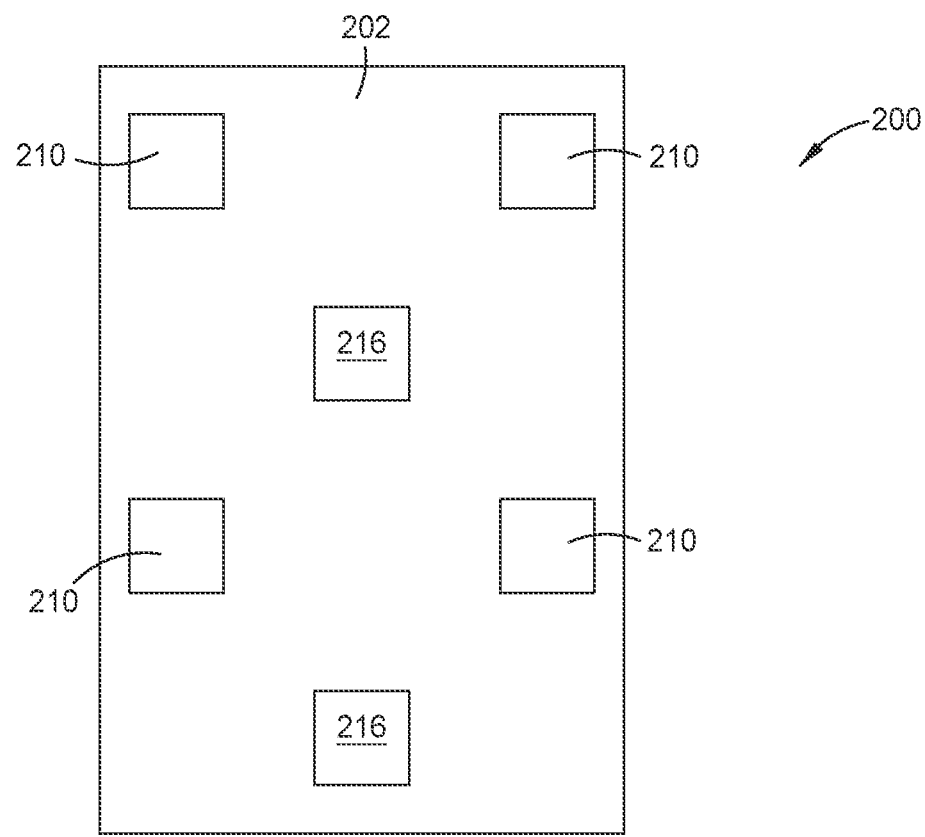
FIG. 7A is an example schematic top view of part of the workpiece shown in FIG. 6.
Figure 7B:
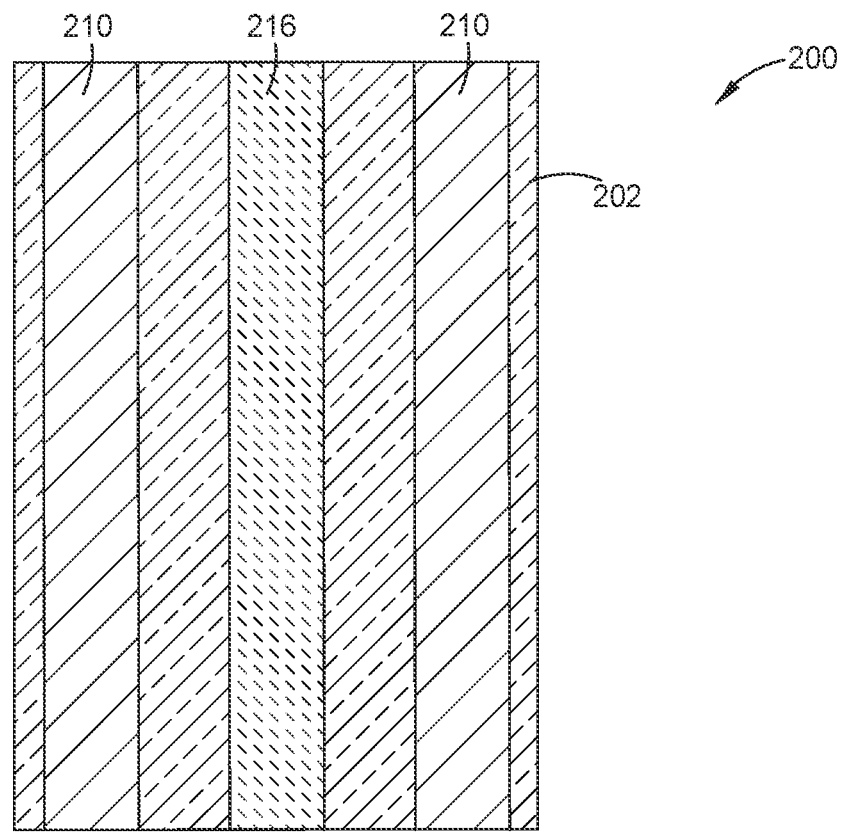
FIG. 7B is another example schematic top view of part of the workpiece shown in FIG. 6.

Following exposure of the workpiece 200 to the plasma and the creation of a resilient layer 216 in the exposed gap fill material 210, the blocking mask layer 212 is removed, revealing the remaining surface of hardmask 202, untreated gap fill material 210, along with treated gap fill material 210, as shown in FIGS. 7A and 7B (top view of workpiece 200).

FIGS. 7A and 7B Illustrate schematic example top views of sections of the workpiece 200 following the completion of operation 110 and removal of the remaining blocking mask layer 212. FIG. 7A shows some individual gaps in the hardmask 202 containing untreated gap fill material 210, and other individual gaps in the hardmask 202 containing treated gap fill material 210 showing the resilient layer 216. FIG. 7B shows an example similar to that of FIG. 7A in which the gaps in the hardmask 202 are for the construction of bit lines and/or word lines. In an example, the untreated gap fill material 210 occupies a space for an eventual bit line, and the treated gap fill material 210 having a resilient layer 216 formed on the gap fill material 210 occupies a space for an eventual word line. In another example, the untreated gap fill material 210 occupies a space for an eventual word line, and the treated gap fill material 210 having a resilient layer 216 formed on the gap fill material 210 occupies a space for an eventual bit line. The results for such arrangements after undergoing methods of the present disclosure are shown and described in FIGS. 16A and 16B, respectively.

Figure 8:
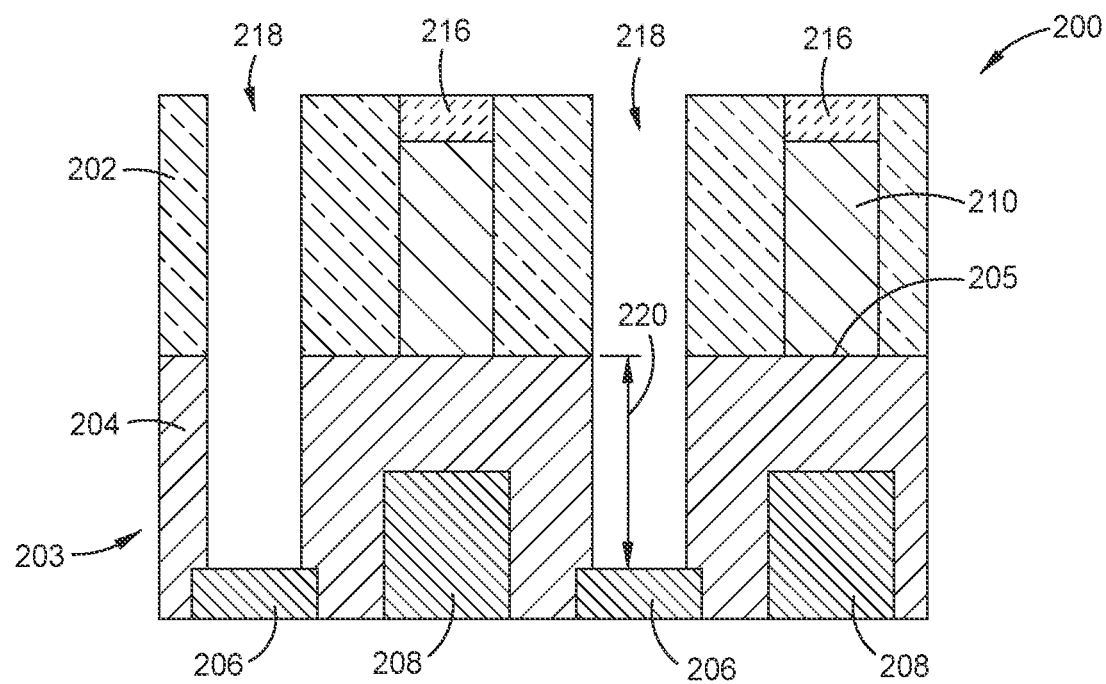
FIG. 8 is a schematic side view of the workpiece after completion of another operation of the method of FIG. 1.

In operation 112 of FIG. 1, and as shown in FIG. 8, the workpiece 200 is subjected to a first etch process. The first etch removes the gap fill material 210 that does include a resilient layer 216 formed thereon. The resilient layer 216 of the gap fill material 210 that had been exposed to the plasma in operation 106 is more resistant than untreated gap fill material 210 to the first etch treatment, and therefore is relatively unaffected by the first etch treatment. Thus, the untreated gap fill material 210 that is exposed to the first etch treatment is removed from the workpiece 200, but the untreated gap fill material 210 that is shielded by the resilient layer 216 remains in place on the workpiece 200. The removal of the gap fill material 210 creates one or more first cavities 218. It is contemplated that the one or more first cavities 218 may be of any shape and any size suitable for the manufacture of a semiconductor device. For example, the one or more first cavities 218 may include a hole (e.g., via hole), a trench, or a combination of a hole and a trench. The creation of the first cavities 218 may result in portions of the interconnect layer 204 becoming exposed. As shown in FIG. 8, exposed portions of the interconnect layer 204 are removed such that the first cavities 218 extend into the interconnect layer 204. The first cavities 218 are etched to a first depth 220 below the top surface 205 of the interconnect layer 204. Creation of the first cavities 218 may expose the first elements 206 that had been formed in manufacturing operations conducted prior to operation 102.

In one embodiment, the first etch is a dry etching process. The plasma chemistry used in the dry etching process is selected to achieve the desired etch selectivity between the to be etched the untreated gap fill material 210 relative to the resilient layer 216 and hard mask 202 materials. For example, if the hardmask 202 material is a nitride, such as silicon nitride (SiN), the gap fill material 210 is an oxide (e.g., SiOx), and the resilient layer 216 includes a nitrided gap fill material (e.g., SiON), the plasma includes oxygen so as to preferentially etch the untreated gap fill material 210. Alternatively, if the hardmask 202 material is an oxide, such as silicon dioxide (SiO2), the gap fill material 210 is a nitride (e.g., SiN) and the resilient layer 216 includes a nitrided and oxidized gap fill material (e.g., SiON), the plasma includes nitrogen so as to preferentially etch the gap fill material 210.

Figure 9:
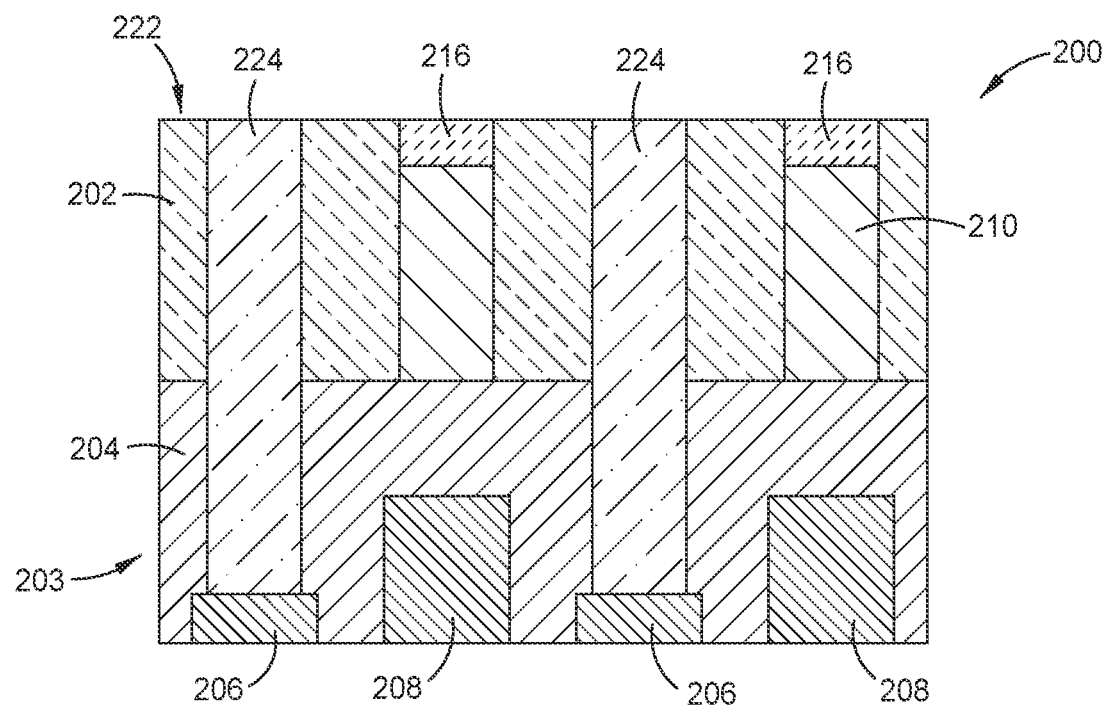
FIG. 9 is a schematic side view of the workpiece after completion of another operation of the method of FIG. 1.

In operation 114 of FIG. 1, and as shown in FIG. 9, the workpiece 200 is subjected to a fill process in which the first cavities 218 created in operation 112 are filled with a first metal-containing material, to create first metal-containing features 224. Example metals that may be included in the first metal-containing features 224 include, but are not limited to, aluminum, cobalt, copper, iridium, molybdenum, nickel, platinum, rhodium, ruthenium, tantalum, titanium, tungsten, and other conductive metals or metal alloys typically used in the fabrication of semiconductor devices. The first metal-containing material is deposited in the first cavities 218 and in contact with the first elements 206 in the interconnect layer 204. The first metal-containing material is deposited to fill the space previously occupied by the gap fill material 210. Deposition of the first metal-containing material is followed by a planarization process, such as by chemical mechanical polishing process, resulting in the workpiece 200 having a substantially planar top surface 222.

Figure 10:
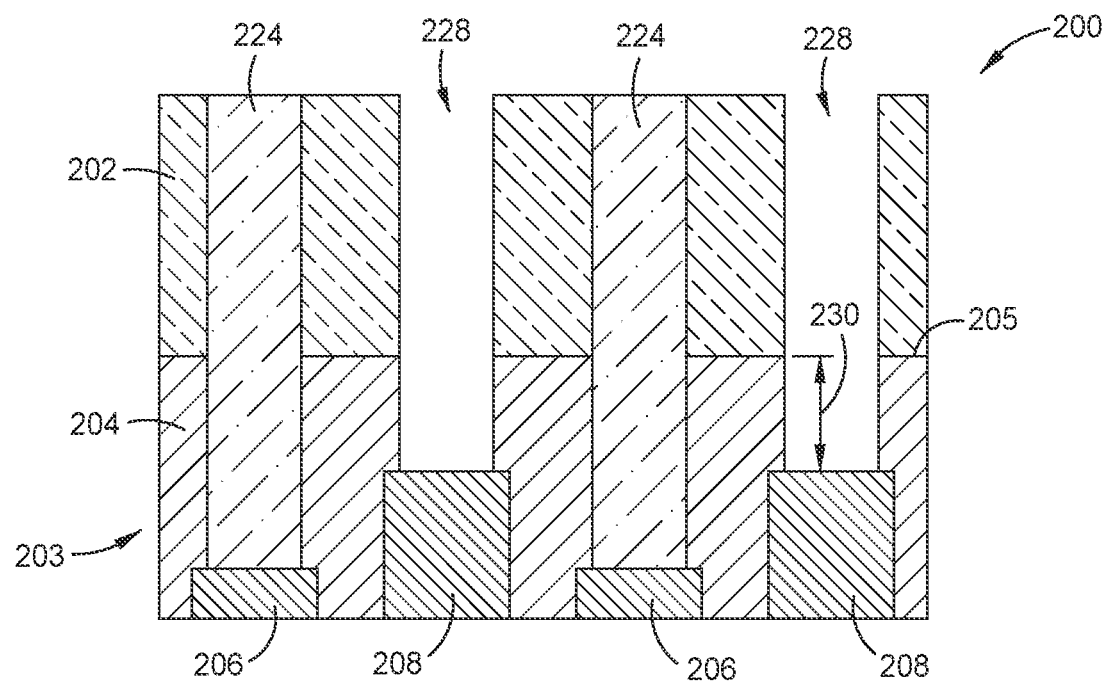
FIG. 10 is a schematic side view of the workpiece after completion of another operation of the method of FIG. 1.

In operation 116 of FIG. 1, and as shown in FIG. 10, the workpiece 200 is subjected to a second etch process. The second etch removes remaining gap fill material 210, including gap fill material 210 having the resilient layer 216. As shown in FIG. 10, the second etch is configured to preferentially remove the remaining gap fill material 210, including gap fill material 210 having the resilient layer 216, while leaving the hardmask 202 and first metal-containing material deposited in operation 114 relatively undisturbed.

The removal of the remaining gap fill material 210 creates one or more second cavities 228. It is contemplated that the one or more second cavities 228 may be of any shape and any size suitable for the manufacture of a semiconductor device. For example, the one or more second cavities 228 may include a post hole, a trench, or a combination of a post hole and a trench. The creation of the second cavities 228 results in portions of the interconnect layer 204 becoming exposed. As shown in FIG. 10, exposed portions of the interconnect layer 204 are also removed by the second etch process such that second cavities 228 extend into the interconnect layer 204. The second cavities 228 are etched to a second depth 230 below the top surface 205 of the interconnect layer 204, which in some cases, as shown in FIG. 10, is different from the first depth 220. Creation of the second cavities 228 exposes the second elements 208 that had been formed in manufacturing operations conducted prior to operation 102.

Figure 11:
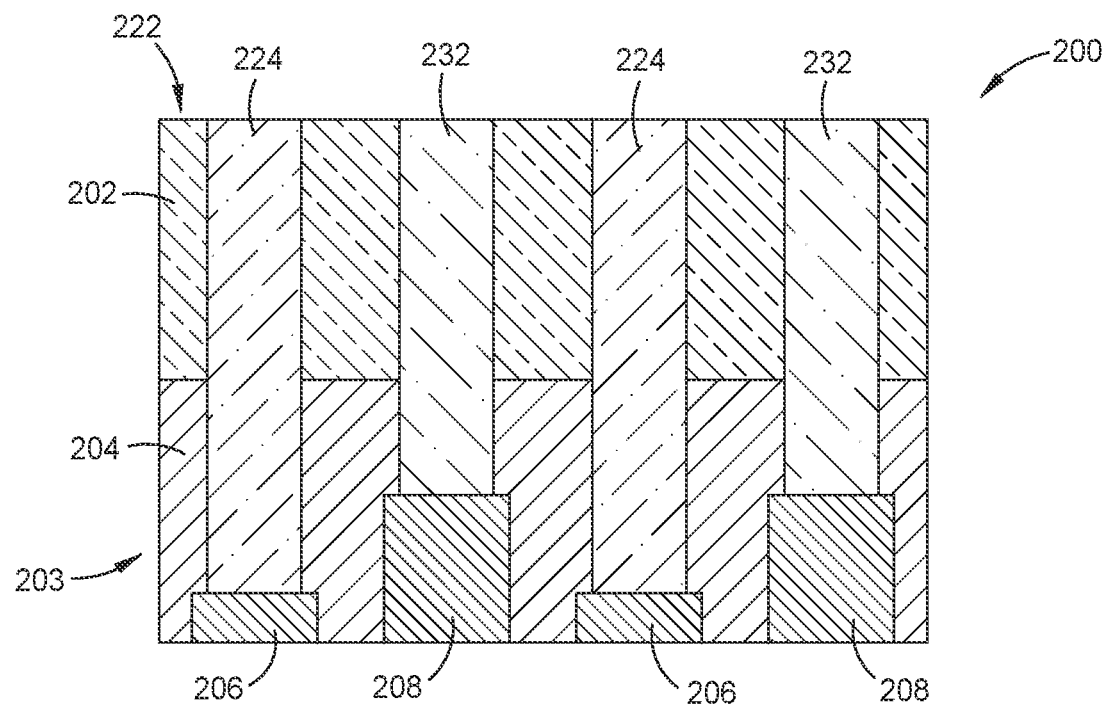
FIG. 11 is a schematic side view of the workpiece after completion of another operation of the method of FIG. 1.

In operation 118 of FIG. 1, and as shown in FIG. 11, the workpiece 200 of FIG. 10 is subjected to a fill process, in which the second cavities 228 created in operation 116 are filled with a second metal-containing material, to create second metal-containing features 232. Example metals utilized to form the second metal-containing features 232 include, but are not limited to, aluminum, cobalt, copper, iridium, molybdenum, nickel, platinum, rhodium, ruthenium, tantalum, titanium, tungsten, and others typically used in the fabrication of semiconductor devices. In some embodiments, the second metal-containing material is the same as the first metal-containing material. In other embodiments, the second metal-containing material is different from the first metal-containing material. The second metal-containing material is deposited in the second cavities 228 and in contact with the second elements 208 in the interconnect layer 204. In one embodiment, the second metal-containing material is deposited to fill the space previously occupied by the gap fill material 210. In one embodiment, deposition of the second metal-containing material is followed by a planarization process, such as by chemical mechanical polishing process, resulting in the workpiece 200 having a substantially planar top surface 222.

Alternate Process Sequence Example

Figure 12:
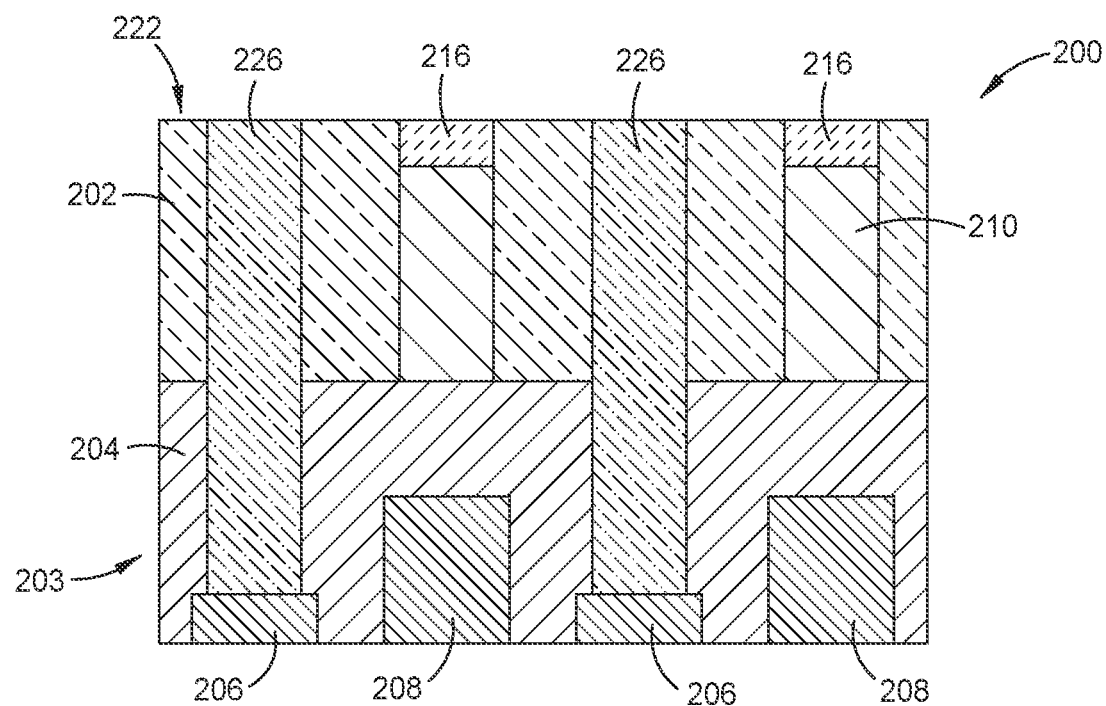
FIG. 12 is a schematic side view of the workpiece after completion of another operation of the method of FIG. 1.

After operation 112, instead of performing operations 114, 116, and 118, an alternate process sequence includes operations 120, 122, 124, and 126. In operation 120 of FIG. 1, and as shown in FIG. 12, the workpiece 200 is subjected to a fill process in which the first cavities 218 created in operation 112 are filled with a temporary fill material 226. Examples of temporary fill material 226 include carbon containing materials, photoresist materials, and bottom anti-reflective coating (BARC) materials. Carbon, when used as temporary fill material 226, may be formed on the workpiece 200 by a spin-on process. In one embodiment, the temporary fill material 226 is deposited to fill the space previously occupied by the gap fill material 210. A subsequent excess material removal process is performed to remove portions of the temporary fill material that are positioned over the surface top 222 by use of a planarization or develop process to selectively remove the excess material therefrom. In some embodiments, the temporary fill material includes a spin-on flowable oxide material, which could be later selectively removed by use of hydrofluoric acid etch or similar process.

Figure 13:
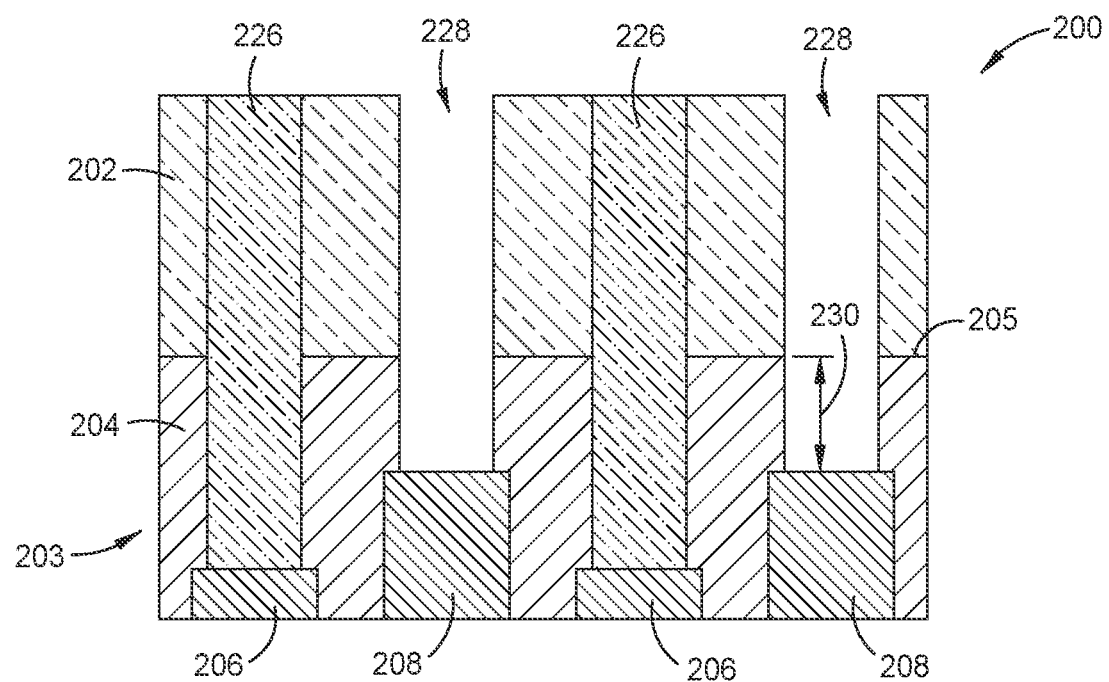
FIG. 13 is a schematic side view of the workpiece after completion of another operation of the method of FIG. 1.

In operation 122 of FIG. 1, and as shown in FIG. 13, the workpiece 200 is subjected to a second etch process. The second etch removes remaining gap fill material 210, including gap fill material 210 having the resilient layer 216. As shown in FIG. 13, the second etch is configured to preferentially remove the remaining gap fill material 210, including gap fill material 210 having the resilient layer 216, while leaving the hardmask 202 and the temporary fill material 226 deposited in operation 120 relatively undisturbed.

The removal of the remaining gap fill material 210 creates one or more second cavities 228. The creation of the second cavities 228 results in portions of the interconnect layer 204 becoming exposed. As shown in FIG. 13, exposed portions of the interconnect layer 204 are also removed by the second etch process such that second cavities 228 extend into the interconnect layer 204. The second cavities 228 are etched to a second depth 230 below the top surface 205 of the interconnect layer 204, which in some cases, as shown in FIG. 13, is different from the first depth 220. Creation of the second cavities 228 exposes the second elements 208 that had been formed in manufacturing operations conducted prior to operation 102.

Figure 14:
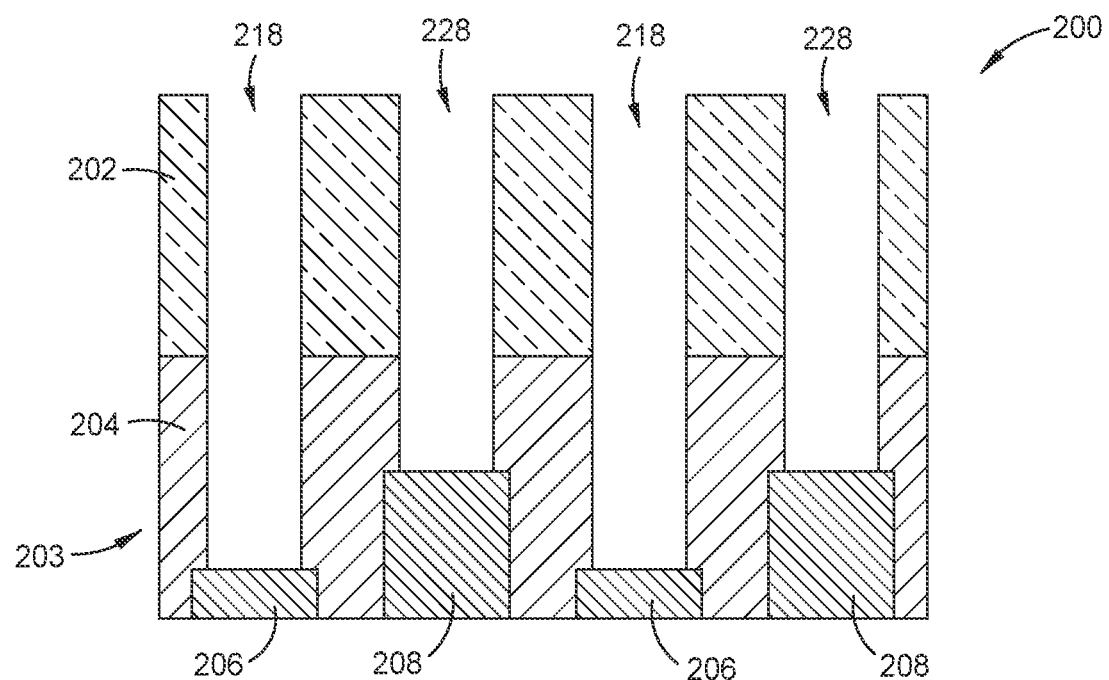
FIG. 14 is a schematic side view of the workpiece after completion of another operation of the method of FIG. 1.

In operation 124 of FIG. 1, and as shown in FIG. 14, the workpiece 200 of FIG. 13 is subjected to a process that removes the temporary fill material 226 that had been deposited in operation 120. The removal of the temporary fill material is performed by use of a develop process or other selective etch process (e.g., a third etch process) to selectively remove the temporary fill material therefrom. Removal of the temporary fill material 226 results in exposure of the first elements 206 in the interconnect layer 204. The workpiece 200 now has first cavities 218 and second cavities 228 in the interconnect layer 204, and the first and second elements 208 are exposed.

Figure 15:
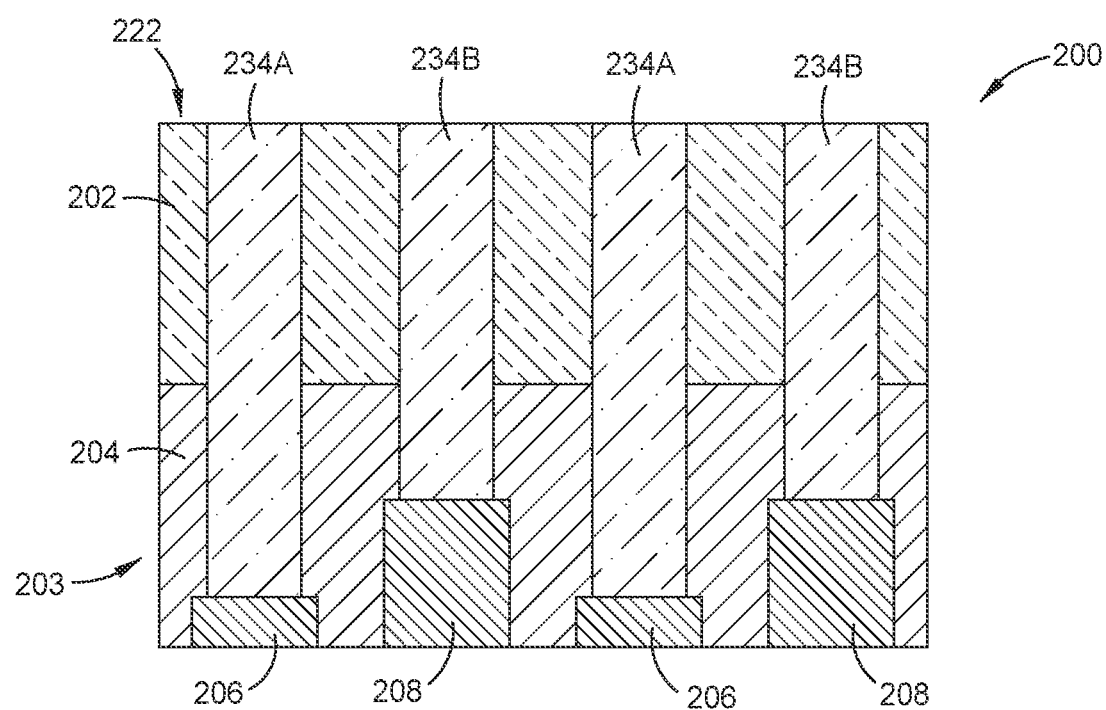
FIG. 15 is a schematic side view of the workpiece after completion of another operation of the method of FIG. 1.

In operation 126 of FIG. 1, and as shown in FIG. 15, the workpiece 200 of FIG. 14 is subjected to a fill process in which the first and second cavities 218, 228 of the workpiece 200 of FIG. 14 are filled with a metal-containing material to create metal-containing features 234A and 234B. Example metals utilized to form the metal-containing features 234A and 234B include, but are not limited to, aluminum, cobalt, copper, iridium, molybdenum, nickel, platinum, rhodium, ruthenium, tantalum, titanium, tungsten, and others typically used in the fabrication of semiconductor devices. The metal-containing material is deposited in the first and second cavities 218, 228 and in contact with the first and second elements 206, 208 in the interconnect layer 204. The metal-containing material is deposited to fill the space previously occupied by the gap fill material 210. In one embodiment, deposition of the metal-containing material is followed by a planarization process, such as by chemical mechanical polishing process, resulting in the workpiece 200 having a substantially planar top surface 222.

Figure 16A:
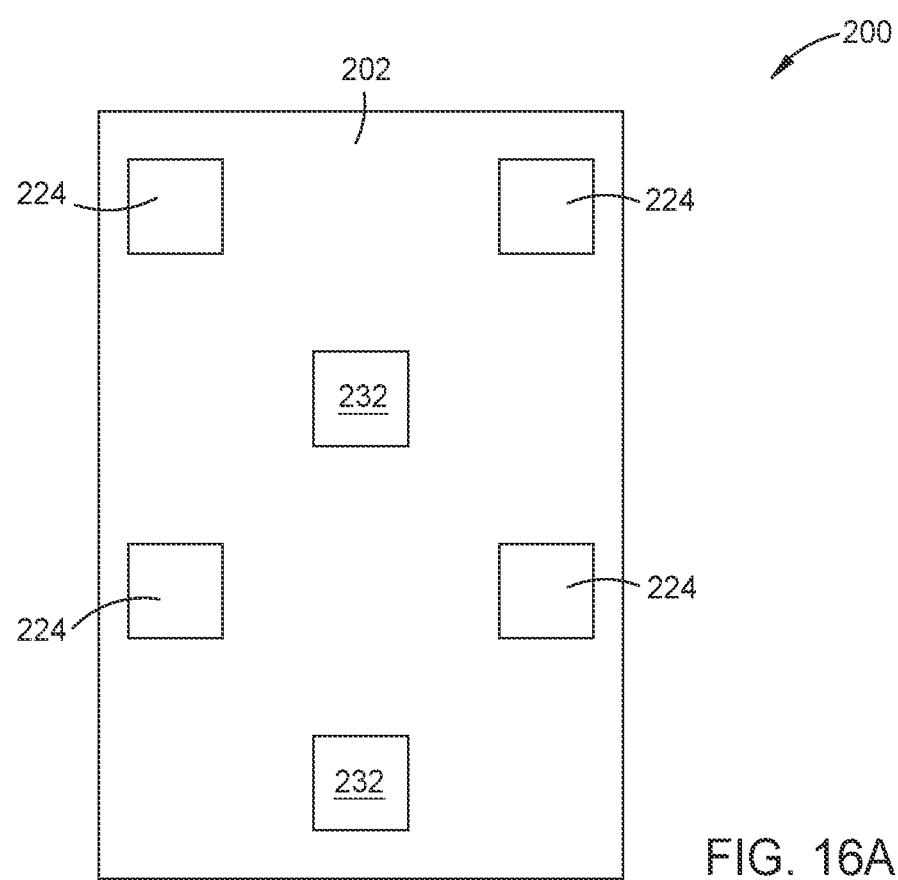
FIG. 16A is an example schematic top view of part of the workpiece shown in FIG. 11.
Figure 16B:
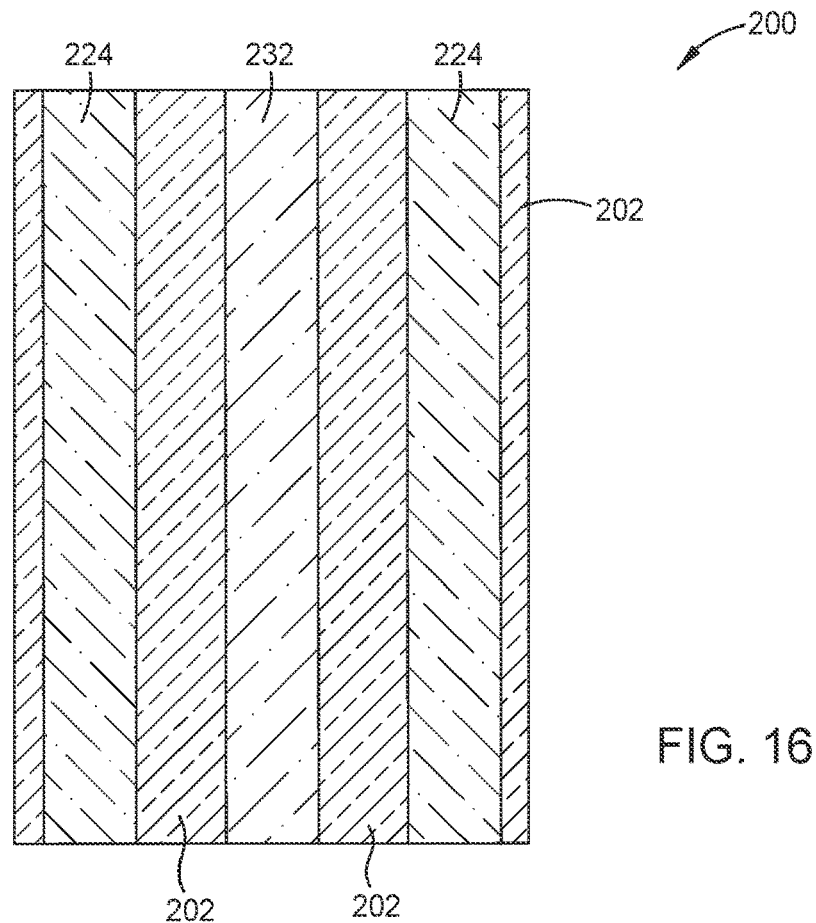
FIG. 16B is another example schematic top view of part of the workpiece shown in FIG. 11.

FIGS. 16A and 16B illustrate schematic example top views of sections of the workpiece 200 following the completion of operation 118. FIG. 16A shows the result achieved from operations 112, 114, 116, and 118 being applied to the example illustrated in FIG. 7A. FIG. 16B shows the result achieved from operations 112, 114, 116, and 118 being applied to the example illustrated in FIG. 7B. Thus, FIG. 16B provides an example in which one of the first metal-containing feature 224 and second metal-containing feature 232 is a bit line and the other of the first metal-containing feature 224 and second metal-containing feature 232 is a word line. As shown in FIGS. 16A and 16B, the methods of the present disclosure provide for the fabrication of precisely defined and consistent boundaries and spacing of the first metal-containing features 224 and second metal-containing features 232. Particularly with reference to FIG. 16B, spacing between a bit line contact and a word line contact may be controlled within a close tolerance, such as within +/−7 nm, such as within +/−6 nm, such as within +/−5 nm, such as within +/−4 nm, due to the ability to selectively remove portions of the hardmask 202 and then fill and selectively remove portions of gap fill materials disposed in the space created by the removed portion of the hardmask 202 without significantly etching the hardmask 202 materials.

Figure 16C:
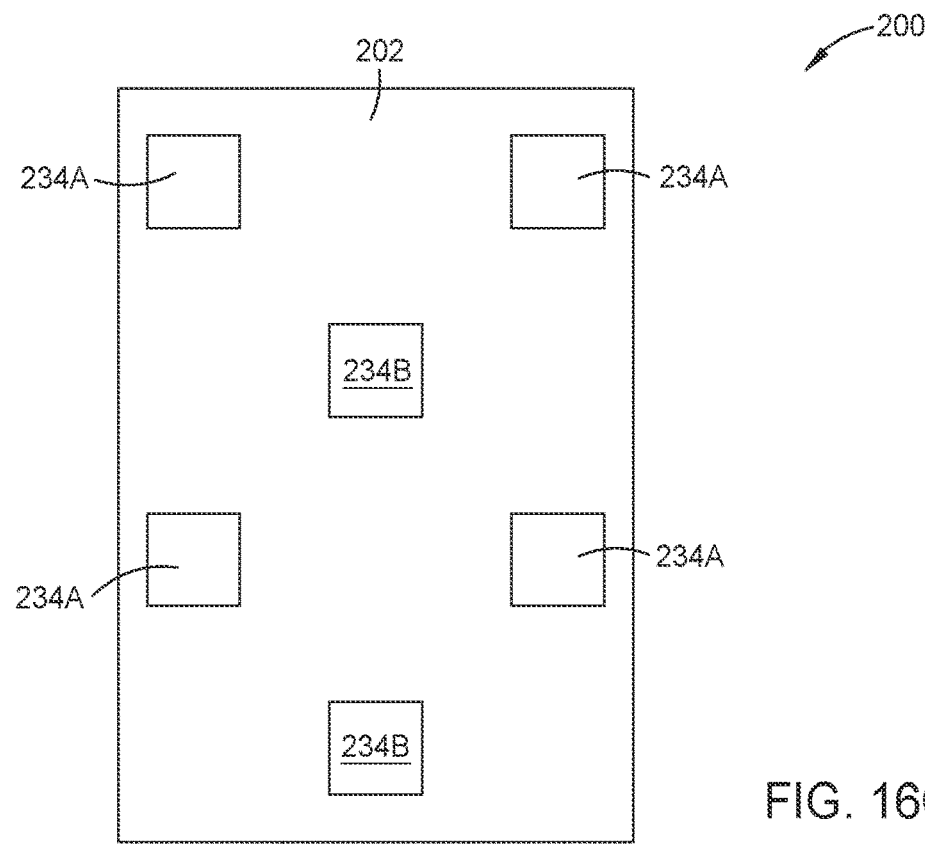
FIG. 16C is an example schematic top view of part of the workpiece shown in FIG. 15.
Figure 16D:
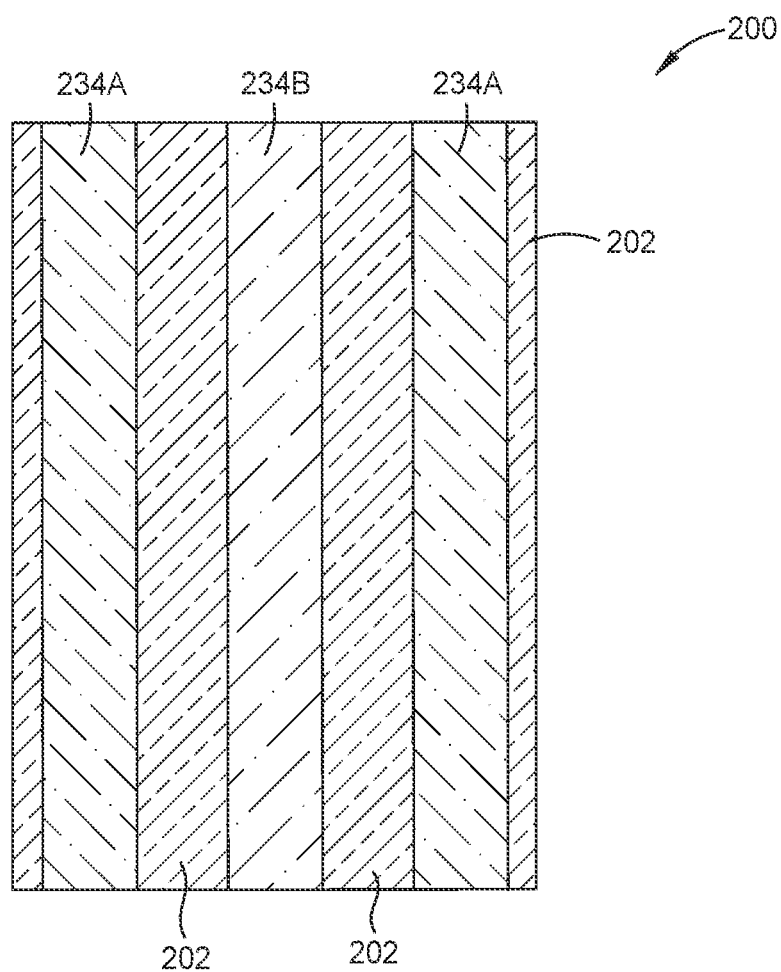
FIG. 16D is another example schematic top view of part of the workpiece shown in FIG. 15.

FIGS. 16C and 16D illustrate schematic example top views of sections of the workpiece 200 following the completion of operation 126. FIG. 16C shows the result achieved from operations 112, 120, 122, 124 and 126 being applied to the example illustrated in FIG. 7A. FIG. 16D shows the result achieved from operations 112, 120, 122, 124 and 126 being applied to the example illustrated in FIG. 7B. Thus, FIG. 16D provides an example in which one of the metal-containing features 234A and 234B is a bit line and the other of the metal-containing features 234A and 234B is a word line. As shown in FIGS. 16C and 16D, the methods of the present disclosure provide for the fabrication of precisely defined and consistent boundaries and spacing of the metal-containing features 234A and 234B. Particularly with reference to FIG. 16D, spacing between a bit line contact and a word line contact may be controlled within a close tolerance, such as within +/−7 nm, such as within +/−6 nm, such as within +/−5 nm, such as within +/−4 nm, due to the ability to selectively remove portions of the hardmask 202 and then fill and selectively remove portions of gap fill materials disposed in the space created by the removed portion of the hardmask 202 without significantly etching the hardmask 202 materials.

The methods of the present disclosure enable the creation of two or more metal-containing features in a substrate in which each metal-containing feature includes a different metal and/or each metal-containing feature is formed at a different depth in the substrate. The methods of the present disclosure also enable the creation of two or more metal-containing features in a substrate in which each metal-containing feature includes a different metal and/or each metal-containing feature is formed at the same depth in the substrate. The methods of the present disclosure enable the creation of two or more metal-containing features in a substrate in which each metal-containing feature includes the same metal and each metal-containing feature is formed at a different depth in the substrate. The methods of the present disclosure enable the creation of two or more metal-containing features in a substrate in which each metal-containing feature includes the same metal and each metal-containing feature is formed at the same depth in the substrate. The methods of the present disclosure also enable different open regions in the patterned hardmask structure to be formed with at least two different materials without affecting the CD of the hardmask during processing.

As a result of the methods of the present disclosure, the final spacing between adjacent metal-containing features may be controlled within a close tolerance, such as within +/−7 nm, such as within +/−6 nm, such as within +/−5 nm, such as within +/−4 nm.

Additional Process Sequence Examples

Figure 17A:
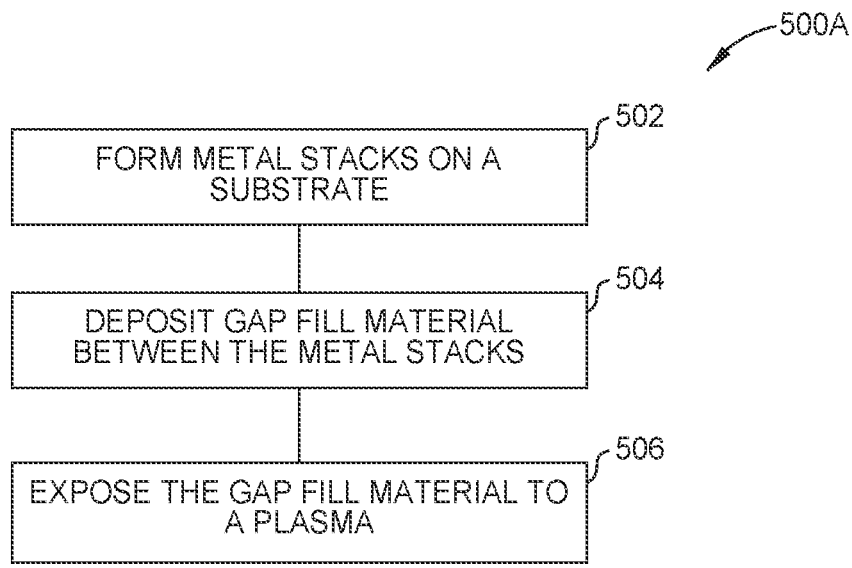
FIG. 17A is a flowchart of method operations for use in manufacturing a semiconductor device.
Figure 17B:
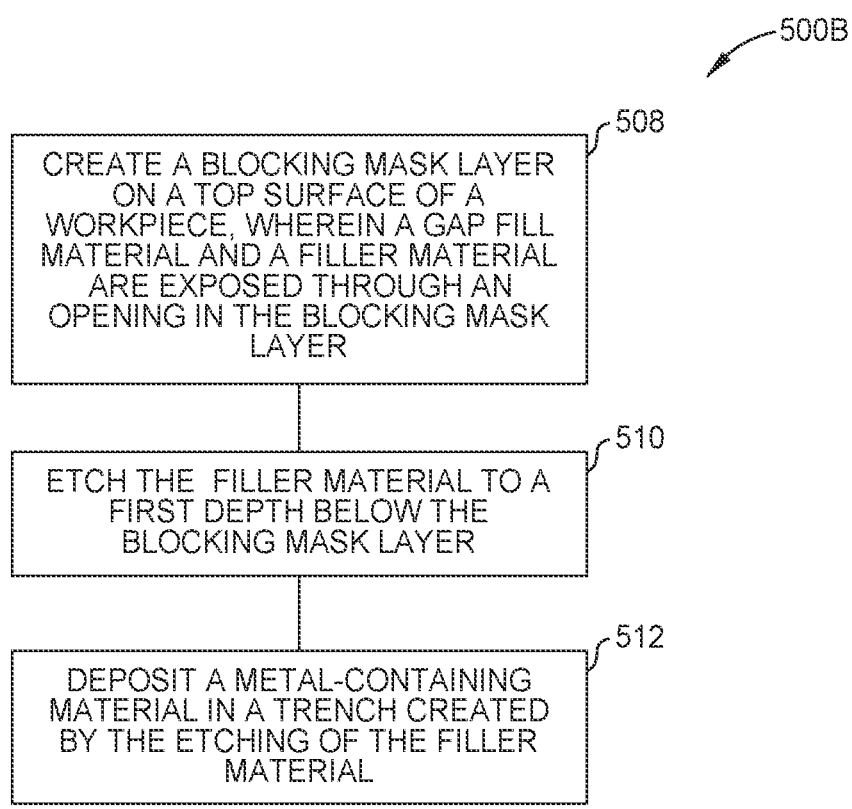
FIG. 17B is a flowchart of method operations for use in manufacturing a semiconductor device.
Figure 17C:
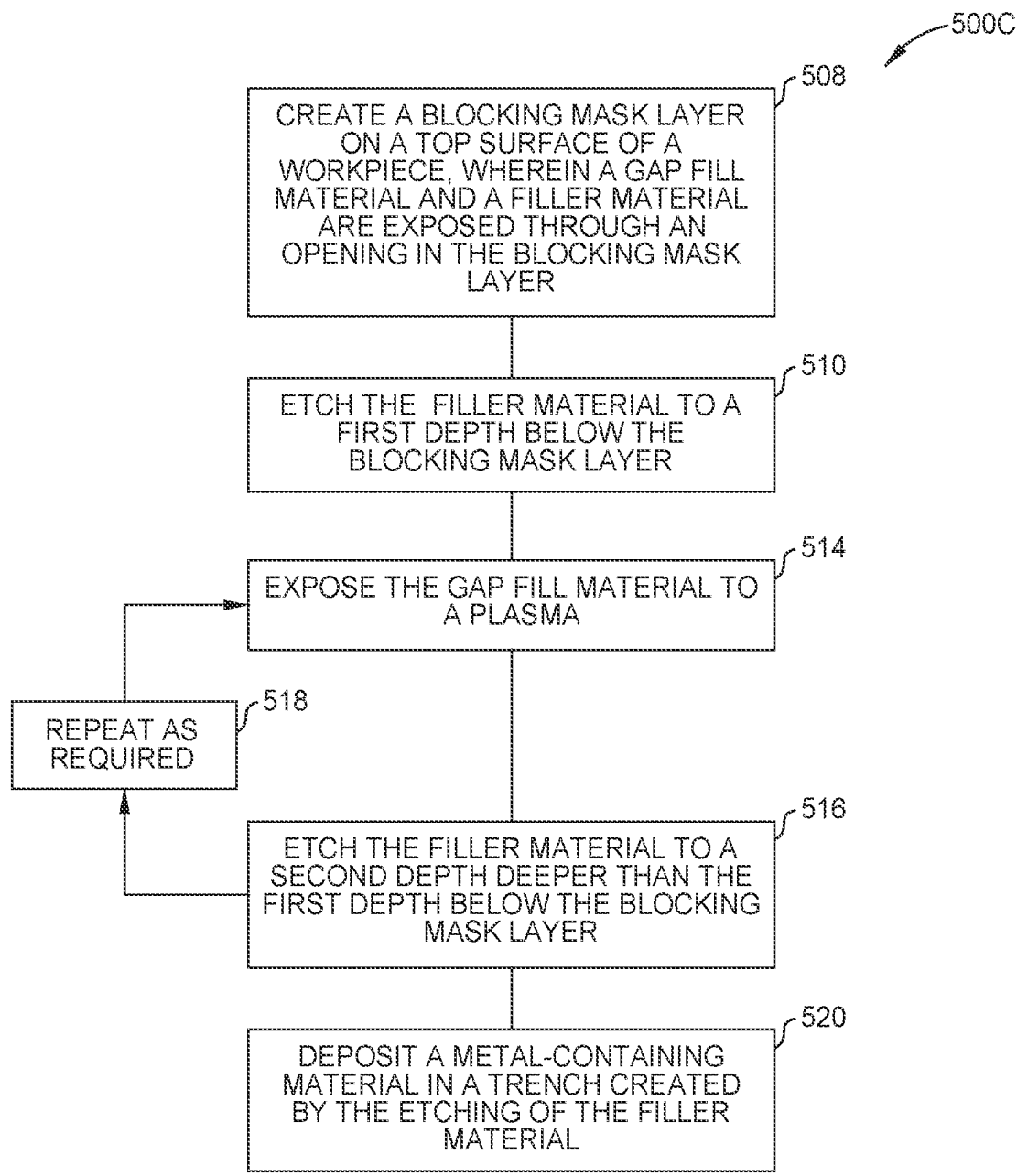
FIG. 17C is a flowchart of method operations for use in manufacturing a semiconductor device.
Figure 18A:
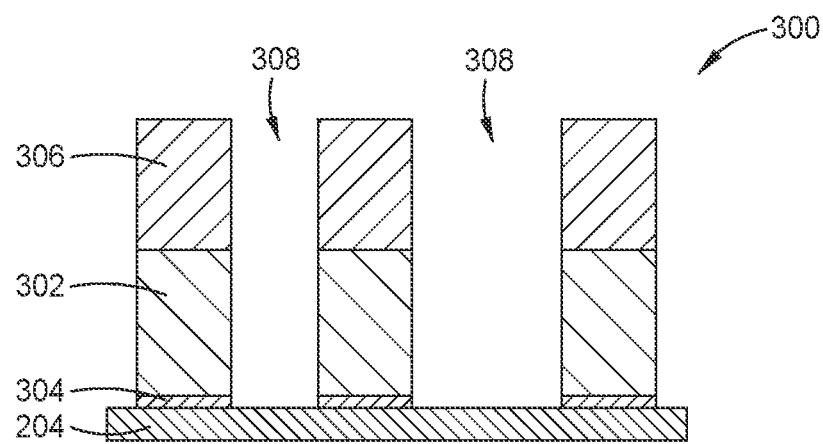
FIG. 18A is a schematic side view of a workpiece after completion of selected operations of the method of FIG. 17A.
Figure 18B:
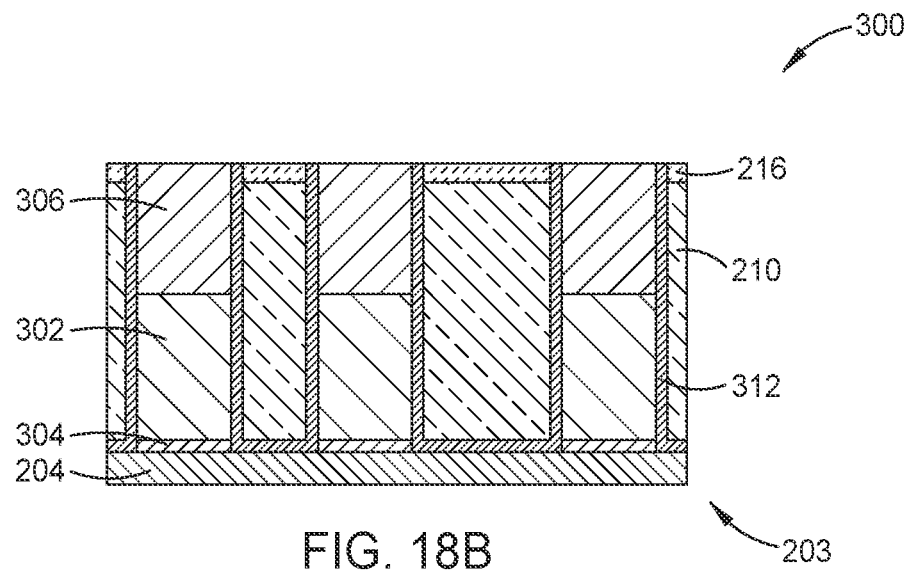
FIG. 18B is a schematic side view of the workpiece of FIG. 18A after completion of selected operations of the method of FIG. 17A.

FIGS. 17A-17C provides methods 500A to 500C for use in manufacturing a semiconductor device. FIGS. 18A to 18B illustrate results of selected operations of the method 500A of FIG. 17A. In operation 502, a metal liner 304 is formed on a substrate. A workpiece includes a substrate, on which the metal liner 304 is formed. A metal layer 302 is formed on the metal liner 304, and a filler material 306 is formed on the metal layer 302. The workpiece 300 is subjected to an etching process, such as through a hardmask, in which portions of the filler material, metal body, and metal liner are removed, thereby forming one or more first cavities 308 in which portions of the substrate 203 are exposed. It is contemplated that the one or more first cavities 308 may be of any shape and any size suitable for the manufacture of a semiconductor device. For example, the one or more first cavities 308 may include a post hole, a trench, or a combination of a post hole and a trench. FIG. 18A illustrates the result of the etching process. The workpiece 300 includes one or more metal layers 302, each metal layer 302 being disposed atop a metal liner 304. Each metal liner 304 is disposed on, or at least partially in, an interconnect layer 204 of substrate 203. The substrate 203 may be any of the substrate structures and substrate materials described herein. The interconnect layer 204 may be any of the interconnect layer structures and interconnect layer materials described herein. A filler material 306, such as a dielectric material (for example silicon dioxide or silicon nitride) or a metal material (for example aluminum, copper, molybdenum, ruthenium, or tungsten) is disposed atop each metal layer 302.

In some embodiments, a liner 312 may then be deposited on the workpiece 300. The liner may be deposited onto the exposed surfaces of the metal layer 302, the filer material 306, and the interconnect layer 204 of the substrate 203 by a CVD or ALD process. It is contemplated that the liner 312 may have a thickness from about 10 Å to about 15 Å, and include a dielectric material such as a low-k dielectric. In some embodiments, the liner 312 may be omitted.

In operation 504, a gap fill material 210, such as any of the gap fill materials described herein, is deposited in the cavities 308 formed between the stacks of the metal layer 302 and filler material 306. In some embodiments, the workpiece 300 is then subjected to a planarizing process, such as CMP, as described above.

In operation 506, the workpiece 300 is exposed to a plasma, as described above with respect to operation 110 of method 100. The gap fill material 210 that is exposed to the plasma forms a resilient layer 216, such as described above. FIG. 18B illustrates the result after operation 506. Workpiece 300 is shown having a liner 312 located alongside each metal layer 302 and each column of filler material 306 such that the liner 312 extends along sidewalls of each metal layer 302 and each column of filler material 306. The gap fill material 210 includes a resilient layer 216 which is formed at the top of the gap fill material 210.

Figure 18C:
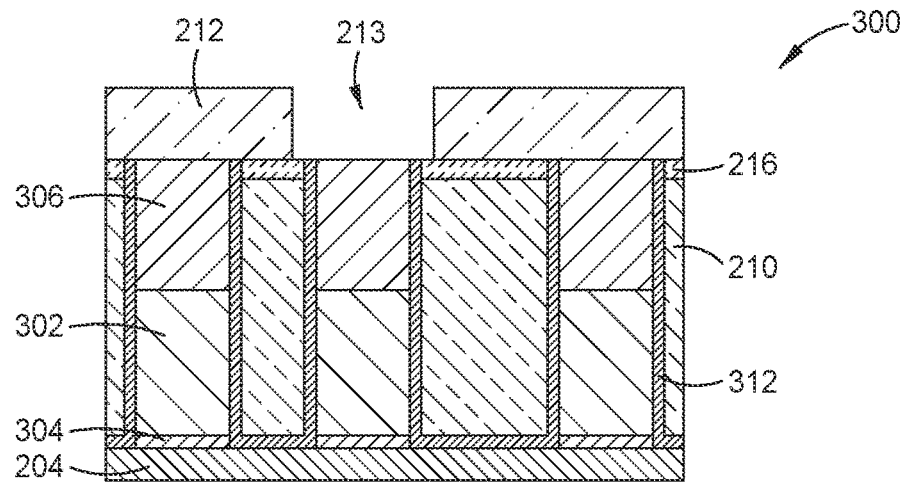
FIG. 18C is a schematic side view of the workpiece of FIG. 18B after completion of selected operations of the method of FIG. 17B.
Figure 18D:
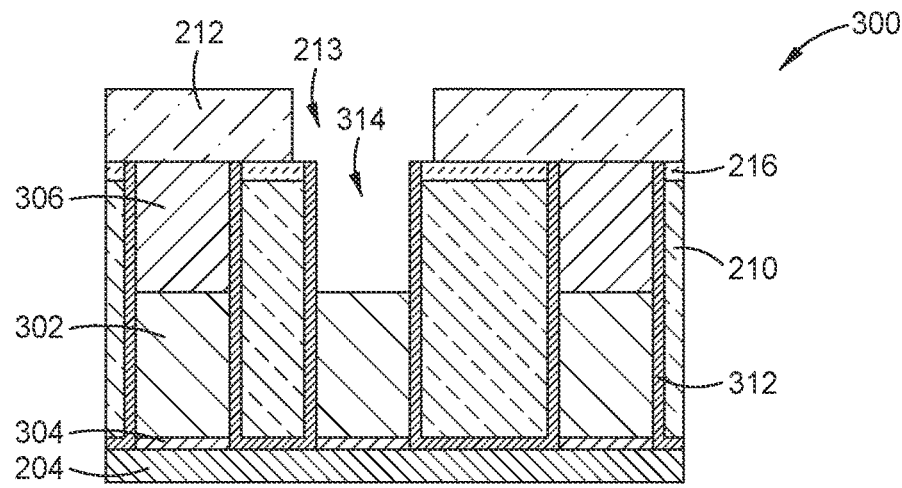
FIG. 18D is a schematic side view of the workpiece of FIG. 18C after completion of selected operations of the method of FIG. 17B.
Figure 18E:
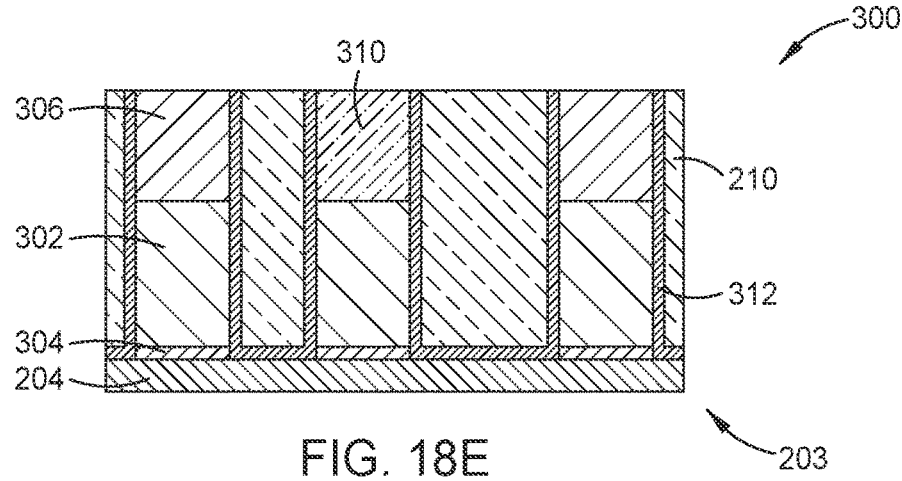
FIG. 18E is a schematic side view of the workpiece of FIG. 18D after completion of selected operations of the method of FIG. 17B.

FIGS. 18C-18E illustrate results of selected operations of the method 500B of FIG. 17B. It is envisaged that method 500B may be conducted after conducting the operations of method 500A. It is also envisaged that method 500B may be conducted as a stand-alone method. In operation 508, and as shown in FIG. 18C, a blocking mask layer 212 is deposited or otherwise formed on the workpiece 300. The blocking mask layer 212 is fabricated using the method described above with respect to operation 108 and FIG. 5. The blocking mask layer 212 includes the opening 213 that exposes part of the top surface of the workpiece 300, including one of the units of filler material 306 atop a metal layer 302 and a portion of the resilient layer 216 of the gap fill material 210.

In operation 510, and as shown in FIG. 18D, the exposed filler material 306 is etched to a first depth. The exposed filler material 306 is removed, whereas the exposed gap fill material 210 having a resilient layer 216 is relatively unaffected by the etch, and is relatively undisturbed. As such, one or more second cavities 314 are formed in the workpiece 300. It is contemplated that the one or more second cavities 314 may be of any shape and any size suitable for the manufacture of a semiconductor device. For example, the one or more second cavities 314 may include a post hole, a trench, or a combination of a post hole and a trench.

In operation 512, and as shown in FIG. 18E, a metal-containing material is deposited in the one or more second cavities 314, creating a metal-containing feature 310. The metal-containing material may include a metal such as any one or more of the metals of the first or second metal-containing features 224, 232 described above. FIG. 18E also shows the result after a subsequent planarizing process, in which the blocking mask layer 212 and resilient layer 216 of the remaining gap fill material 210 has been removed.

Figure 19A:
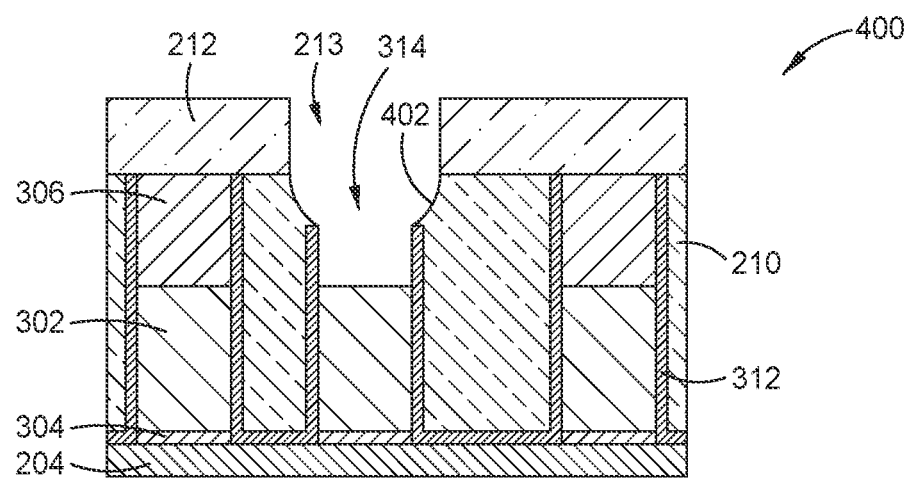
FIG. 19A is a schematic side view of a comparative workpiece after completion of selected operations of the method of FIG. 17B.
Figure 19B:
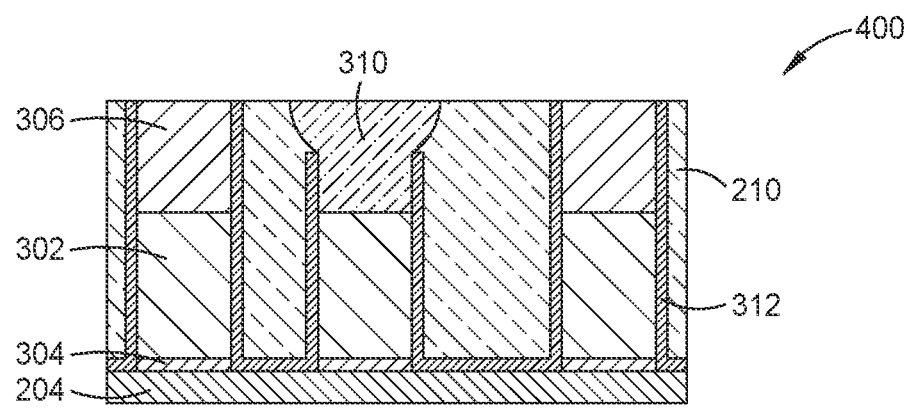
FIG. 19B is a schematic side view of the comparative workpiece of FIG. 19A after completion of selected operations of the method of FIG. 17B.

FIGS. 19A and 19B illustrate a workpiece 400 comparable to the workpiece 300 of FIGS. 18A to 18E except that in executing method 500A, operation 506 is omitted. Hence, the gap fill material 210 of the workpiece 400 has not been exposed to a plasma, and therefore a resilient layer is not formed. It is also envisaged that the workpiece 400 may be formed using a method that is different from method 500A before executing the operations of method 500B. As illustrated in FIG. 19A, the etching process of operation 510 of method 500B removes some of the gap fill material 210 in addition to the filler material 306, due to a lower than desired etch selectivity between the gap fill material 210 and the filler material 306. Removal of some of the gap fill material 210 during the filler material etch process creates a void 402 that is wider than the original width of the one or more second cavities 314 created by the removal of the filler material 306. Thus, as shown in FIG. 19B, deposition of the metal-containing material in the one or more second cavities 314 also results in the creation of the metal-containing feature 310 in the void 402.

Figure 20A:
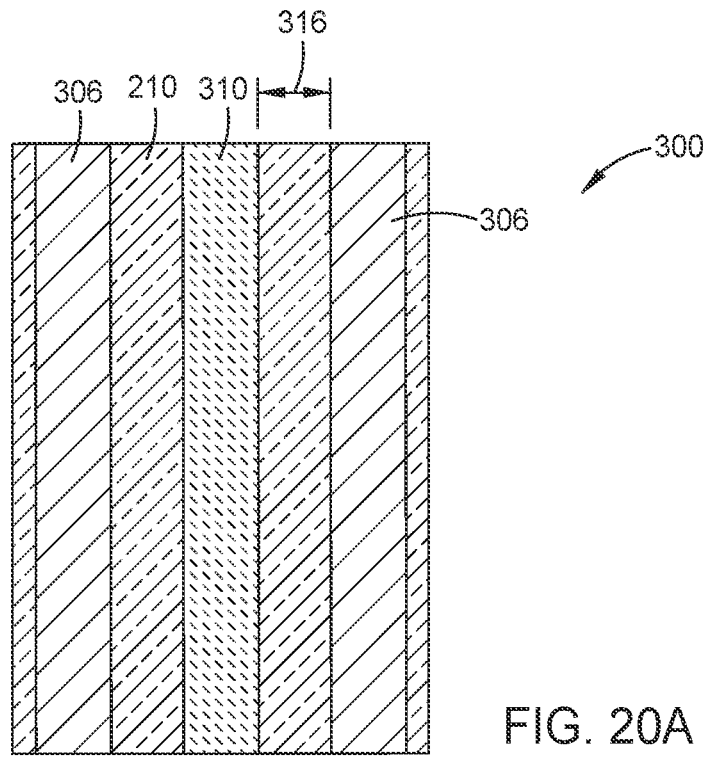
FIG. 20A is an example schematic top view of the workpiece of FIG. 18E.
Figure 20B:
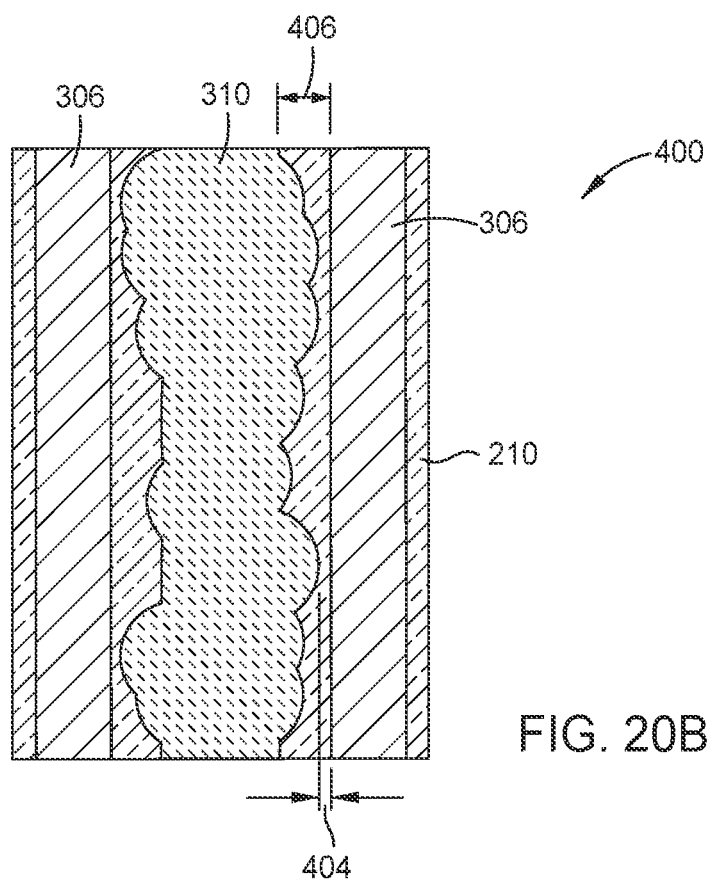
FIG. 20B is an example schematic top view of the workpiece of FIG. 19B.

FIGS. 20A and 20B show top views of the workpiece 300 of FIG. 18E and the workpiece 400 of FIG. 19B, respectively. FIG. 20A illustrates consistent separation 316 between the metal-containing feature 310 and the filler material 306. Management of the integrity of the gap fill material 210 by the process of forming the resilient layer 216 also results in the separation 316 between the metal-containing feature 310 and the remaining (non-etched) filler material 306 being substantially close to a desired separation. It is contemplated that a magnitude of the separation 316 may be maintained within a close tolerance, such as within +/−7 nm, such as within +/−6 nm, such as within +/−5 nm, such as within +/−4 nm. Thus, in embodiments in which a metal is subsequently deposited in place of or on top of the remaining (non-etched) surface filler material, the risk of an unwanted short circuit between the deposited metal and the metal-containing feature 310 may be reduced or eliminated.

FIG. 20B illustrates an inconsistent separation 404 between the metal-containing feature 310 and the remaining (non-etched) filler material 306. Such irregularity is caused by the formation of voids 402, as illustrated in FIG. 19A, and results in a variation of the separation 404 between the metal-containing feature 310 and the remaining (non-etched) filler material 306. As illustrated in FIG. 20B, such a variation of separation 404 may be substantially less than a desired separation 406 in one or more locations. Thus, in situations in which a metal is subsequently deposited in place of or on top of the remaining (non-etched) filler material 306, the risk of an unwanted short circuit between the deposited metal and the metal-containing feature 310 may be greater than with the configuration of FIG. 20A.

Figure 21A:
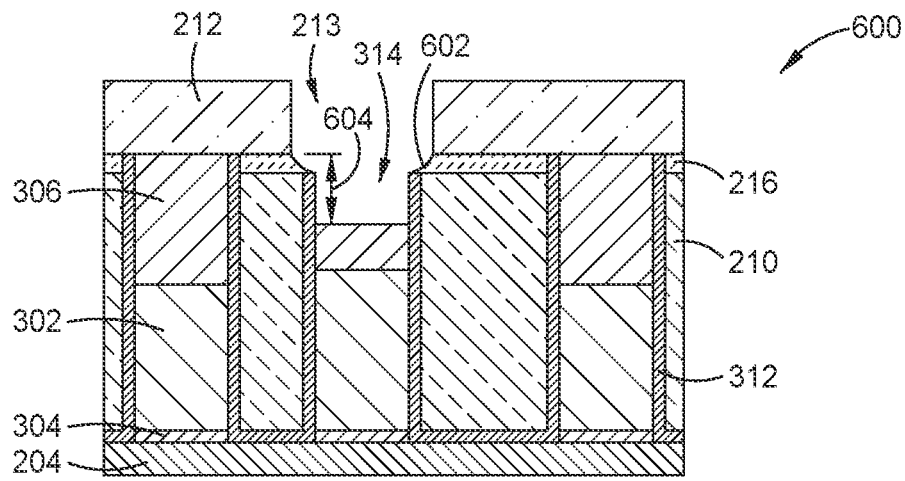
FIG. 21A is a schematic side view of another workpiece after completion of selected operations of the method of FIG. 17C.
Figure 21B:
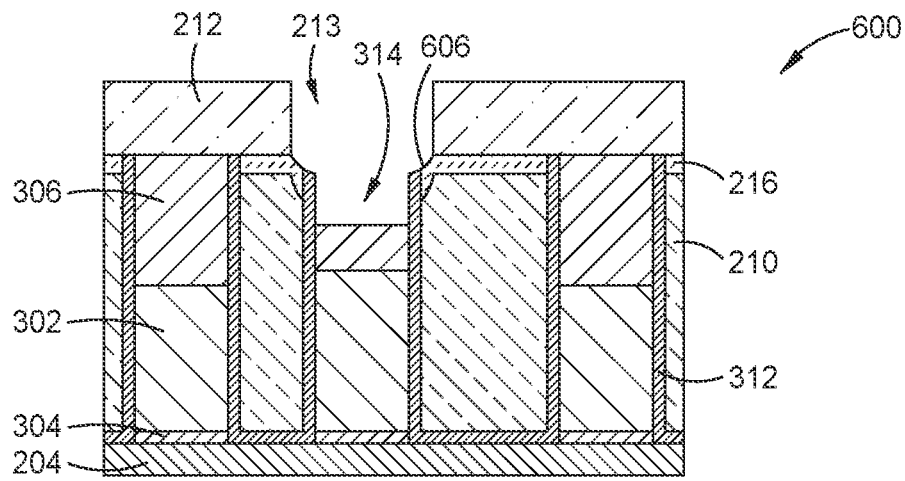
FIG. 21B is a schematic side view of the workpiece of FIG. 21A after completion of selected operations of the method of FIG. 17C.
Figure 21C:
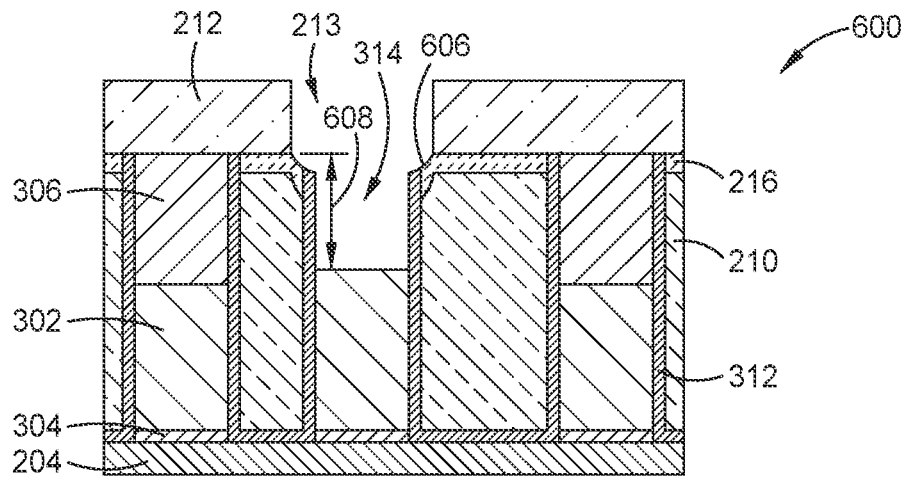
FIG. 21C is a schematic side view of the workpiece of FIG. 21B after completion of selected operations of the method of FIG. 17C.

FIGS. 21A to 21C illustrate results of selected operations of the method 500C of FIG. 17C. It is envisaged that method 500C may be conducted after conducting the operations of method 500A. It is also envisaged that method 500C may be conducted as a stand-alone method. Method 500C involves sequentially alternating the operations of forming the resilient layer 216 in the gap fill material 210 and performing the etch of the surface of the filler material 306 in order to avoid, or mitigate, unwanted degradation and removal of the gap fill material 210 during the etching process.

FIG. 21A shows a workpiece 600 similar to workpiece 300, and having a liner 312 located alongside each metal layer 302 and each column of filler material 306 such that the liner 312 extends along sidewalls of each metal layer 302 and each column of filler material 306. The gap fill material 210 includes a resilient layer 216 which is formed on the top of the gap fill material 210. In operation 508, and as shown in FIG. 21A, a blocking mask layer 212 is deposited or otherwise formed on the workpiece 600. The blocking mask layer 212 is fabricated using the method described above with respect to operation 108 and FIG. 5. The blocking mask layer 212 includes the opening 213 that exposes part of the top surface of the workpiece 600, including one of the units of filler material 306 atop a metal layer 302 and a portion of the resilient layer 216 of the gap fill material 210.

In operation 510, and as shown in FIG. 21A, the workpiece 600 is subjected to an etching process. The exposed filler material 306 is etched to a first depth 604 below the blocking mask layer 212, creating the one or more second cavities 314. As shown in FIG. 21A, due to lower than desired etch selectivity between the resilient layer 216 of the gap fill material 210 and the filler material 306, the etching process has also removed some of the resilient layer 216 of the gap fill material 210 which forms a void 602. In comparison with workpiece 400, by controlling the etching process, the void 602 will be smaller than the void 402 that would have been formed in the gap fill material 210 if no resilient layer 216 had been formed. In some embodiments, portions of the untreated gap fill material 210 underlying the resilient layer 216 are also removed.

At this point, the etching process is halted, and in operation 514 the gap fill material 210 is subjected to a repeat of the modifying process described above with respect to operation 506 and 110. Thus, the exposed gap fill material is exposed to a plasma. As shown in FIG. 21B, the repetition of the modifying process results in a new resilient layer 606 being formed in the exposed gap fill material 210. Hence, a repair of the resilient layer 216 is enabled in accordance with the repetitive use of the modifying process described herein to reduce the unwanted lateral etching of the gap fill layer 210. In some embodiments, the gap fill layer modifying process (e.g., operation 506, 514, 110) is performed at least once after operation 510 has been started. In some embodiments, it is contemplated that the gap fill layer modifying process is performed after a predetermined number of angstroms of the filler material has been removed during operation 510, such as after every 10 Å, every 25 Å, 50 Å or every 100 Å.

In operation 516, and as shown in FIG. 21C, the etching process is then resumed to etch the fill material 306 to a second depth 608 (greater than the first depth 604) below the blocking mask layer 212. Thus, the one or more second cavities 314 is deepened.

The duration of an etching process may be estimated according to the etch rate and thickness of the material being etched. In one embodiment, if the duration utilized to remove the filler material 306 is greater than or equal to the time it would take for the resilient layer 216 to become eroded, breached, or otherwise compromised, then a repair, such as by repeating operation 514 and as illustrated in FIG. 21B, is utilized. In some embodiments, operation 518 is performed, which involves repeating operations 514 and 516, thus ensuring the continued integrity of the resilient layer 216 throughout the etching process to deepen one or more second cavities 314.

In operation 520, a metal-containing material is deposited in the one or more second cavities 314, creating a metal-containing feature 310. The metal-containing material includes a metal such as any one or more of the metals of the first or second metal-containing features 224, 232 above.

The methods of the present disclosure enable the creation of closely-spaced metal-containing features in and on a substrate. A separation between adjacent metal-containing features can be closely controlled, thereby facilitating the creation of adjacent metal-containing features at less than 20 nm spacing. The separation between adjacent metal-containing features arranged in columns and lines can be closely controlled. Additionally, adjacent metal-containing features can be created at different depths in or on a substrate. Furthermore, adjacent metal-containing features can be created by depositing different metallic substances in or on a substrate. The different metallic substances can be deposited at similar depths or different depths in or on a substrate.

Processing Tool Example

Figure 22:
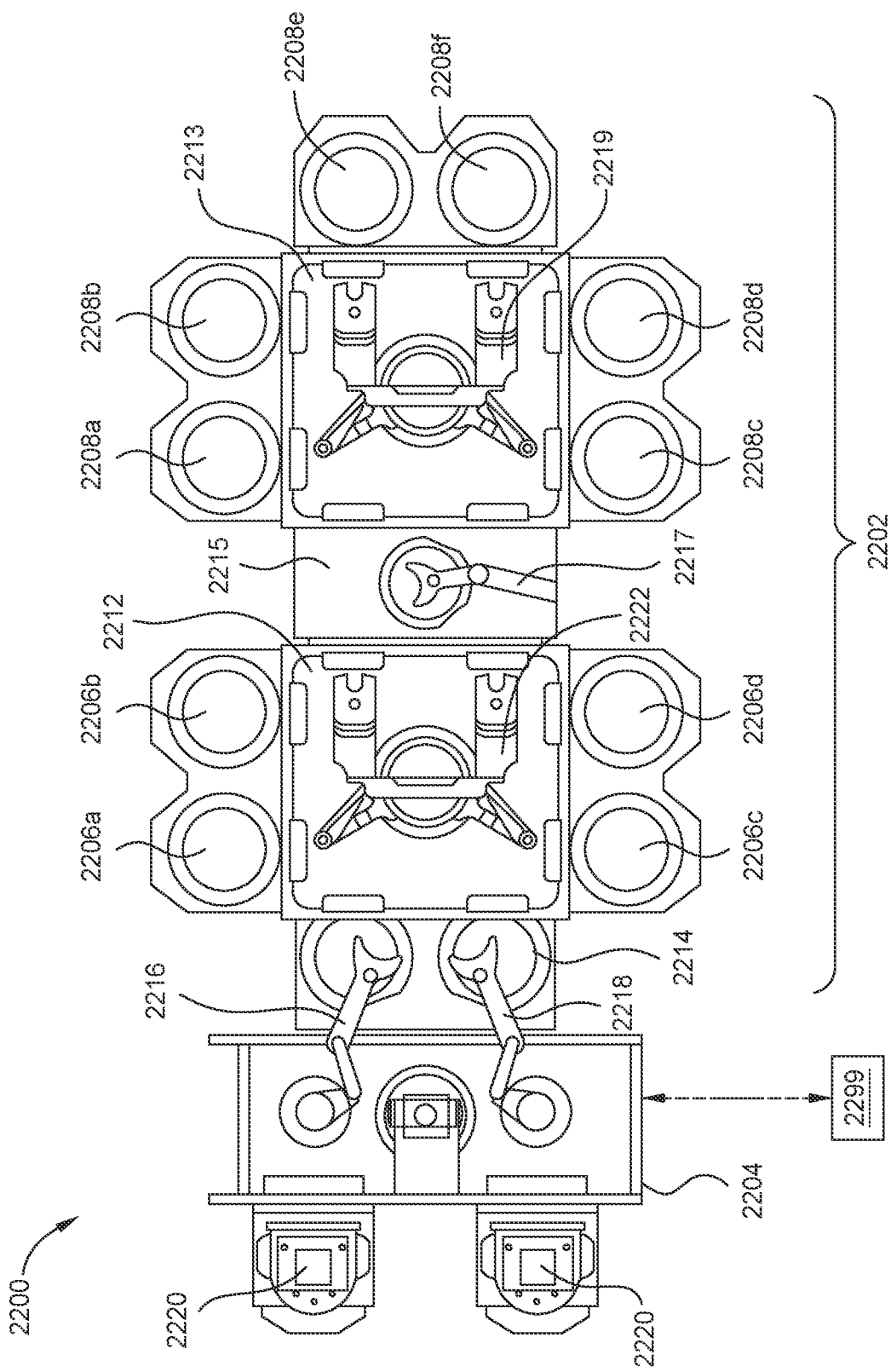
FIG. 22 is a schematic top view of a processing system that can be used to perform one or more of the methods disclosed herein in accordance with implementations of the present disclosure.

FIG. 22 is a schematic top view of a processing system 2200 that can be used to perform one or more of the methods disclosed herein. However, the methods described herein may be performed in individual process chambers that may be provided in a standalone configuration or as part of one or more cluster tools, for example, an integrated tool 2200. Examples of the integrated processing system 2200 may include the ENDURA®, CENTURA®, PRODUCER® or CENTRIST™ line of processing systems, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool including the Applied Materials Eterna™ FCVD™ chamber, Selectra™ Etch chamber, Continuum™ ALD chamber and Radion® ALE chamber.

FIG. 22 is a schematic top view of a processing system 2200 that can be used to perform one or more of the operations disclosed herein. In one exemplary implementation, the processing system 2200 is a high-volume manufacturing (HVM) vacuum processing system that is used to perform certain processes disclosed herein, such as one or more of the operations disclosed in relation to FIGS. 1, 17A, 17B and/or 17C. The processing system 2200 includes a system controller 2299, a vacuum-tight processing platform 2202 and a factory interface 2204. The platform 2202 includes a plurality of processing chambers 2206a-d, 2208a-f coupled to a first vacuum substrate transfer chamber 2212 and a second vacuum substrate transfer chamber 2213, respectively, a cooling station 2215 disposed between the first vacuum substrate transfer chamber 2212 and the second vacuum substrate transfer chamber 2213, and a load lock chamber 2214 that is disposed between and coupled to the first vacuum substrate transfer chamber 2212 and the factory interface 2204.

The factory interface 2204 includes at least one factory interface robot 2216, 2218 to facilitate transfer of substrates. The factory interface 2204 is configured to accept one or more front opening unified pod (FOUP) 2220. In one example, four FOUPs are adapted. The factory interface robots 2216, 2218 transfer the substrates from the factory interface 2204 to the processing platform 2202. At least one transfer robot 2222 at the first vacuum substrate transfer chamber 2212 receives the substrates from the factory interface robots 2216, 2218 and then transfers the substrates to any of the processing chambers 2206a-d.

An optional transfer robot 2217 may be disposed at the cooling station 2215 to transfer the substrates between the first vacuum substrate transfer chamber 2212 and the second vacuum substrate transfer chamber 2213. At least one transfer robot 2219 at the second vacuum substrate transfer chamber 2213 receives the substrates from the cooling station 2215 and then transfers them to any of the processing chambers 2208a-f. Alternatively, the transfer robot 2217 may be omitted and the transfer robot 2217, 2222 can work together to transfer the substrates between the first vacuum substrate transfer chamber 2212 and the second vacuum substrate transfer chamber 2213.

The system controller 2299 controls activities and operating parameters of the automated components found in the processing system 2200. In general, the bulk of the movement of a substrate through the processing system is performed using the various automated devices disclosed herein by use of commands sent by the system controller 2299. The system controller 299 is a general use computer that is used to control one or more components found in the processing system 2200. The system controller 2299 is generally designed to facilitate the control and automation of one or more of the processing sequences disclosed herein and typically includes a central processing unit (CPU) (not shown), memory (not shown), and support circuits (or I/O) (not shown). Software instructions and data can be coded and stored within the memory (e.g., non-transitory computer readable medium) for instructing the CPU. A program (or computer instructions) readable by the processing unit within the system controller determines which tasks are performable in the processing system. For example, the non-transitory computer readable medium includes a program which when executed by the processing unit are configured to perform one or more of the methods described herein. Preferably, the program includes code to perform tasks relating to monitoring, execution and control of the movement, support, and/or positioning of a substrate along with the various processing methods and various related processing chamber process recipe steps being performed.

In some implementations, one or more of the processing chambers 2206a-d or processing chambers 2208a-f are each a plasma processing chamber that may be used to perform portions of operation 104 (e.g., curing process steps during the deposition of the gap fill layer) and/or one or more of the operations 110, 506 and/or 514 described above. In some embodiments, the processing chambers 2206a-d or 2208a-f are each configured to generate either an inductively coupled plasma (ICP), capacitively coupled plasma (CCP) or microwave generated plasma that is configured to interact with the exposed surfaces of the substrate during processing. In some embodiments, the processing chambers 2206a-d are each configured to generate a remote plasma by use of a remote plasma source (RPS) that is configured to generate radicals that are caused to interact with the exposed surfaces of the substrate during processing.

In some implementations, one or more of the processing chambers 2206a-d or processing chambers 2208a-f are deposition chambers that may be used to perform one or more of the processes described in operations 104, 114, 504 and 512. In processing sequences that include operations that require the use of both deposition and plasma processing steps (e.g., operation 104), the substrates may be transferred between the deposition chambers (i.e., processing chambers 2208a-f) and the plasma chambers (i.e., processing chambers 2206a-d) one or more times until the target thickness of the deposited dielectric layer has been reached. In some embodiments, one or more of the processing chambers 2206a-d or processing chambers 2208a-f are configured to deposit a gap fill layer 210, a blocking mask layer 212, a first metal layer 224 and/or a second metal layer 232 by use of a chemical vapor deposition (CVD) process, atomic layer deposition (ALD) process, physical vapor deposition (PVD) process (e.g., sputtering or evaporation deposition process) or other vacuum deposition processing technique.

In some implementations, one or more of the processing chambers 2206a-d or processing chambers 2208a-f are etch-back planarization chambers that may be used to perform one or more of the processes described in operation 106. The etch-back planarization chambers can include dry etch processing chambers that are configured to etch-back one or more exposed layers on the surface of the substrate by use of a plasma, which contains a desirable plasma chemistry (e.g., halogen containing gases) that is tailored to etch the exposed layers during processing. In some embodiments, the etch-back planarization chambers include in-situ metrology components that is configured to detect the endpoint of a desired etch-back process. In one example, an etch-back planarization chamber includes metrology that is configured to detect when the etch-back process has caused the gap fill material 210 in the overburden to be etched back to top surface of the hard mask 202 layer. The metrology process may include optical inspection, gas composition (e.g., RGA analysis) or plasma composition detection techniques that are used by the system controller 2299 to control one or more of the process variables of the etch-back planarization process (e.g., process pressure, RF power, flow rate, temperature, etc.) and/or determine a desired endpoint of the process.

In some implementations, one or more of the processing chambers 2206a-d or processing chambers 2208a-f are configured to perform a selective etching process that is used to perform one or more of the processes described in operation 112, 116, 122, 510 and 516. The selective etch chambers can include dry etch processing chambers (e.g., Radion® processing chambers) that are configured to preferentially etch one or more of the exposed materials on the surface of the substrate by use of a plasma that contains a desirable plasma chemistry (e.g., halogen containing gases). In one example, a dry etching process is used to selectively remove a portion of the gap fill layer 210. As discussed above, in one example, the plasma chemistry used in the dry etching process is selected to achieve the desired etch selectivity between the untreated gap fill material 210 relative to the resilient layer 216 and hard mask 202 materials.

Once all of the processes have been completed within the processing system 2200, the substrates are transferred to the load lock chamber 2214. The factory interface robot 2216, 2218 then pick up the substrates from the load lock chamber 2214 and transports the substrates back to the FOUPs 2220.

In some embodiments, the system controller 2299 is configured to cause a series of patterned substrates to perform a process sequence that includes forming a gap fill layer 210 over a hard mask layer 202 in a first processing chamber 2206a (e.g., operation 104), removing a portion of the formed gap fill layer 210 to expose a portion of the hard mask layer 202 by use of an etch-back process (e.g., operation 106) in a second processing chamber 2208a, exposing portions of the gap fill layer 210 to a plasma (e.g., operation 110) in a third processing chamber 2208e, removing portions of the formed gap fill layer 210 that were not exposed to the plasma (e.g., operation 112) in a fourth processing chamber 2208d, forming a first metal-containing material layer over the surface of the substrate in a fifth processing chamber 2206d, and forming a second metal-containing material layer over the surface of the substrate in a sixth processing chamber 2206c. In some embodiments, a substrate may be subjected to a vacuum break between one or more of the operations in the process sequence to allow some non-vacuum compatible intermediate operations to be performed. In one example, a substrate may be taken out of the processing system 2200 after performing operation 106 so that a patterned blocking mask layer 212 can formed by lithographic techniques over the gap fill layer 210 and hard mask layer 202 prior to performing operation 110 in the processing system 2200. In another example, a substrate may be taken out of the processing system 2200 after performing operation 110 so that the patterned blocking mask layer 212 can be removed from the surface of the gap fill layer 210 and hard mask layer 202 prior to performing operation 112 in the processing system 2200.

In an alternate configuration of method 100, operation 110 is performed before operation 108, and the blocking mask layer 212 is used to help selectively remove operations of the gap fill layer 210 during operation 112. In this process sequence the system controller 2299 is configured to cause a substrate to be taken out of the processing system 2200 after performing operations 104, 106 and 110 so that a patterned blocking mask layer 212 can formed by lithographic techniques over the plasma exposed portions of gap fill layer 210 and hard mask layer 202 prior to performing operations 108 outside of the processing system 2200. After operation 108 has been performed, operation 112 can then be performed in the processing system 2200 or in another processing system.

In other embodiments, the system controller 2299 is configured to cause a series of patterned substrates to be subjected to only a first portion of method 100 that includes forming a gap fill layer 210 over a hard mask layer 202 in a first processing chamber 2206a (e.g., operation 104) and then removing a portion of the formed gap fill layer 210 to expose a portion of the hard mask layer 202 by use of an etch-back process (e.g., operation 106) in a second processing chamber 2208a, without taking the substrate out of the processing system 2200.

In some embodiments, the system controller 2299 is configured to cause a series of patterned substrates to be subjected to only a second portion of method 100 that includes two or more of the operations that include exposing portions of a gap fill layer 210 to a plasma (e.g., operation 110) in a third processing chamber 2208e, removing a blocking mask layer 212 in a fourth processing chamber 2208d (e.g., dry etching process, etch-back process, ashing process, etc.), removing portions of the formed gap fill layer 210 that were not exposed to the plasma (e.g., operation 112) in the fourth processing chamber 2208d or a fifth processing chamber 2206d, and then, optionally, forming a first metal-containing material layer over the surface of the substrate in the sixth processing chamber 2206c. In some embodiments, the second portion of method 100 is performed without taking the substrate out of the processing system 2200 (i.e., no vacuum break).

In some other embodiments, the system controller 2299 is configured to cause a series of patterned substrates to be subjected to an alternate second portion of method 100 that includes exposing portions of a gap fill layer 210 to a plasma (e.g., operation 110) in a third processing chamber 2208e, removing a blocking mask layer 212 in a fourth processing chamber 2208d (e.g., dry etching process, etch-back process, ashing process, etc.), removing portions of the formed gap fill layer 210 that were not exposed to the plasma (e.g., operation 112) in the fourth processing chamber 2208d or a fifth processing chamber 2206d, and then removing the portions of the formed gap fill layer 210 that were exposed to the plasma and portions of the underlying unexposed gap fill layer material in the fourth processing chamber 2208d or the fifth processing chamber 2206d. Then, optionally, forming a first metal-containing material layer over the surface of the substrate in the sixth processing chamber 2206c.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
   creating a mask on a top surface of a workpiece, wherein a first portion of a gap fill material is overlaid by the mask and a second portion of the gap fill material is exposed through an opening in the mask;
   exposing the workpiece to a plasma, wherein the first portion of the gap fill material is shielded from the plasma by the mask, and the second portion of the gap fill material is modified by exposure to the plasma;
   exposing the first portion of the gap fill material and the second portion of the gap fill material to an etching process, wherein the etching process:
      selectively removes the first portion of the gap fill material versus the second portion of the gap fill material; and
      etches the first portion of the gap fill material to form a first cavity;
   depositing a temporary fill material in the first cavity;
   etching the second portion of the gap fill material to create a second cavity while the temporary fill material remains in place;
   removing the temporary fill material from the first cavity; and
   depositing a metal-containing substance in the first and second cavities to create a metal-containing feature.

2. The method of claim 1, wherein the second portion of the gap fill material develops a resilient layer as a result of being modified by the exposure to the plasma.

3. The method of claim 2, wherein the resilient layer has a thickness less than a thickness of the second portion of the gap fill material.

4. The method of claim 1, wherein the first cavity extends to a first depth into an underlying substrate, thereby exposing a first element within the underlying substrate.

5. The method of claim 4, wherein the second cavity extends to a second depth into the underlying substrate, thereby exposing a second element within the underlying substrate.

6. The method of claim 5, wherein the second depth is different from the first depth.

7. The method of claim 5, wherein depositing the metal-containing substance in the first and second cavities further comprises contacting the first and second elements with the metal-containing substance, and substantially filling the first and second cavities with the metal-containing substance.

8. The method of claim 7, wherein the metal-containing substance includes a metal selected from a list consisting of aluminum, cobalt, copper, iridium, molybdenum, nickel, platinum, rhodium, ruthenium, tantalum, titanium, tungsten, and combination(s) thereof.

9. A substrate processing method, comprising:
   creating a patterned hardmask containing first openings on a substrate;
   depositing a gap fill material on the substrate in the first openings;
   planarizing the gap fill material to create a planarized surface;
   creating a mask on the planarized surface, the mask containing second openings;
   exposing the mask to a plasma such that a first portion of the gap fill material is shielded from the plasma by the mask, a second portion of the gap fill material is modified by exposure to the plasma through the second openings, and a third portion of the gap fill material below the second portion remains unmodified;
   removing the mask;
   exposing the first portion of the gap fill material and the second portion of the gap fill material to an etching process, wherein the etching process:
      selectively removes the first portion of the gap fill material versus the second portion of the gap fill material; and
      etches the first portion of the gap fill material to form a first cavity;
   depositing a first metal-containing substance in the first cavity to create a first metal-containing feature;
   performing a second etching of the gap fill material to remove the second and third portions of the gap fill material to create a second cavity; and
   depositing a second metal-containing substance in the second cavity to create a second metal-containing feature.

10. The method of claim 9, wherein the first metal-containing substance remains in place in the first cavity while performing the second etching of the gap fill material.

11. The method of claim 9, wherein the second portion of the gap fill material is modified by the exposure to the plasma into a resilient layer.

12. The method of claim 9, wherein the first cavity extends to a first depth into an underlying substrate, thereby exposing a first element within the underlying substrate.

13. The method of claim 12, wherein depositing the first metal-containing substance in the first cavity further comprises contacting the first element with the first metal-containing substance, and substantially filling the first cavity with the first metal-containing substance.

14. The method of claim 13, wherein the first metal-containing substance includes a metal selected from a list consisting of aluminum, cobalt, copper, iridium, molybdenum, nickel, platinum, rhodium, ruthenium, tantalum, titanium, tungsten, and combination(s) thereof.

15. The method of claim 12, wherein the second cavity extends to a second depth in the underlying substrate, thereby exposing a second element within the underlying substrate.

16. The method of claim 15, wherein the second depth is different from the first depth.

17. The method of claim 15, wherein depositing the second metal-containing substance in the second cavity further comprises contacting the second element with the second metal-containing substance, and substantially filling the second cavity with the second metal-containing substance.

18. The method of claim 17, wherein the second metal-containing substance includes a metal selected from a list consisting of aluminum, cobalt, copper, iridium, molybdenum, nickel, platinum, rhodium, ruthenium, tantalum, titanium, tungsten, and combination(s) thereof.

19. The method of claim 9, wherein the second metal-containing substance is a same substance as the first metal-containing substance.

* * * * *